United States Patent
Zhou et al.

(10) Patent No.: US 10,461,135 B2
(45) Date of Patent: Oct. 29, 2019

(54) FLEXIBLE DISPLAY PANEL AND FABRICATION METHOD THEREOF, AND FLEXIBLE DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventors: Xingyao Zhou, Shanghai (CN); Yang Zeng, Shanghai (CN); Qijun Yao, Shanghai (CN); Liang Liu, Shanghai (CN)

(73) Assignees: Shanghai Tianma Micro-Electronics Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 151 days.

(21) Appl. No.: 15/464,849

(22) Filed: Mar. 21, 2017

(65) Prior Publication Data
US 2017/0194384 A1    Jul. 6, 2017

(30) Foreign Application Priority Data
Oct. 24, 2016 (CN) .......................... 2016 1 0936680

(51) Int. Cl.
*H01L 27/32* (2006.01)
*H01L 51/52* (2006.01)
*H01L 51/00* (2006.01)

(52) U.S. Cl.
CPC ........ *H01L 27/323* (2013.01); *H01L 51/0097* (2013.01); *H01L 51/5281* (2013.01); *H01L 2251/5338* (2013.01)

(58) Field of Classification Search
None
See application file for complete search history.

(56) References Cited

U.S. PATENT DOCUMENTS

| 6,108,064 A * | 8/2000 | Minoura | G02F 1/13363 349/113 |
| 2016/0231852 A1* | 8/2016 | Moon | G06F 3/044 |
| 2017/0344165 A1* | 11/2017 | Heo | G06F 3/0412 |

FOREIGN PATENT DOCUMENTS

| CN | 102216885 A | 10/2011 |
| CN | 204833206 U | 12/2015 |
| KR | 20160067787 | * 5/2016 |

* cited by examiner

*Primary Examiner* — Ifedayo B Iluyomade
(74) *Attorney, Agent, or Firm* — Anova Law Group PLLC

(57) ABSTRACT

A flexible display panel, a flexible display device, and a fabrication method of the flexible display panel are provided. The flexible display panel comprises a stacked structure having a plurality of layers comprising a flexible substrate, a light-emitting device layer, and a polarizing layer stacked in a preset order. The flexible display panel further includes at least one upper-side resistive force-sensitive electrode disposed on a layer above a neutral plane of the stacked structure, and at least one lower-side resistive force-sensitive electrode disposed on a layer below the neutral plane.

17 Claims, 18 Drawing Sheets

FLEXIBLE DISPLAY PANEL AND FABRICATION METHOD THEREOF, AND FLEXIBLE DISPLAY DEVICE

CROSS-REFERENCES TO RELATED APPLICATIONS

This application claims priority of Chinese Patent Application No. 201610936680.7, filed on Oct. 24, 2016, the entire contents of which are hereby incorporated by reference.

FIELD OF THE DISCLOSURE

The present disclosure generally relates to the field of flexible display and, more particularly, relates to a flexible display panel and device, and a fabrication method of the flexible display panel.

BACKGROUND

With the popularization of intelligent electronic devices such as a touch-screen cell-phone, etc., force or pressure sensors have been increasingly applied to such electronic devices, thereby enhancing interactivity of human-machine interface and improving user experience. FIG. 1(A) and FIG. 1(B) illustrate an existing force touch-control technology, respectively. As shown in FIG. 1(A), a central frame is configured under a backlight unit to protect the backlight unit, a liquid crystal display (LCD) panel is disposed above the backlight unit, and a cover glass is disposed above the LCD panel.

Further, a compressible air gap exists between the backlight unit and the LCD panel, a sensor film is disposed in the backlight unit, and a conducting layer (not shown) is disposed in the LCD panel. When force touch-control occurs, the compressible air gap between the LCD panel and the backlight unit changes and the capacitance between the sensor film and the conducting layer in the LCD panel changes. Accordingly, a force or pressure applied by a user may be sensed.

As shown in FIG. 1(B), a flexible organic light-emitting diode (OLED), a capacitive touch-control panel (CTP) and a cover plate are stacked sequentially. A frame may be configured to be outside of and bold the stacked structure, thus providing a protection function. Force-sensitive coils are configured to extend from two ends of the frame to sense a user force.

However, in existing technologies, a technical solution of force touch-control often needs additional components such as a sensor film (as shown in FIG. 1(A)) or a force-sensitive coil (as shown in FIG. 1(B)). Thus, the cost is relatively high and the stacked layers are complicated. When the existing technologies are applied to a flexible display module, the stacked thickness is relatively large, and the flexibility is relatively poor. Accordingly, the bendable requirement cannot be satisfied, and the existing technologies may not be well applied to light and bendable flexible display devices.

The disclosed flexible display panel and fabrication method thereof, and flexible display device are directed to solving at least partial problems set forth above and other problems. It should be noted that, the aformentioned information disclosed in the background section is only used to enhance understanding of the background of the present disclosure, and thus may include information not constituting existing technologies known to those ordinarily skilled in the art.

BRIEF SUMMARY OF THE DISCLOSURE

One aspect of the present disclosure provides a flexible display panel. The flexible display panel comprises a stacked structure having a plurality of layers comprising a flexible substrate, a light-emitting device layer, and a polarizing layer stacked in a preset order. The flexible display panel further includes at least one, upper-side resistive force-sensitive electrode disposed on a layer above a neutral plane of the stacked structure, and at least one lower-side resistive force-sensitive electrode disposed on a layer below the neutral plane.

Another aspect of the present disclosure provides a flexible display device including a flexible display panel. The flexible display panel comprises a stacked structure having a plurality of layers comprising a flexible substrate, a light-emitting device layer, and a polarizing layer stacked in a preset order. The flexible display panel further includes at least one upper-side resistive force-sensitive electrode disposed on a layer above a neutral plane of the stacked structure, and at least one lower-side resistive force-sensitive electrode disposed on a layer below the neutral plane.

Other aspects of the present disclosure can be understood by those skilled in the art in light of the description, the claims, and the drawings of the present disclosure.

BRIEF DESCRIPTION OF THE DRAWINGS

Aforementioned and other goals, features, and, advantages of the present disclosure will become more apparent via detailed descriptions of exemplary embodiments with reference to the accompanying drawings.

DETAILED DESCRIPTION

Figure 1A:
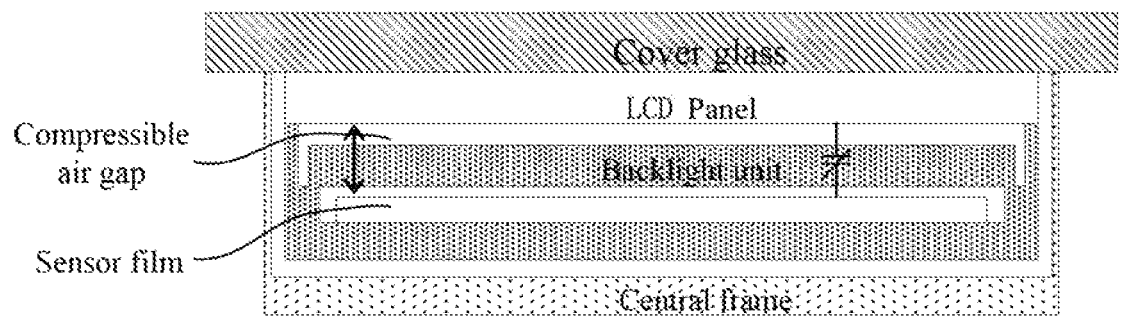
FIGS. 1(A) and FIG. 1(B) respectively illustrate an existing force touch-control technology.
Figure 1B:
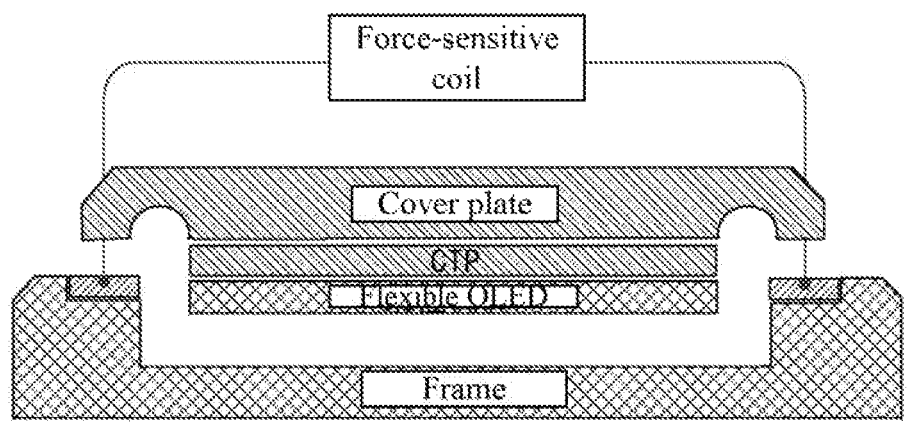

Exemplary embodiments will be described in detail hereinafter with reference to accompanying drawings. However, embodiments of the present disclosure may be implemented in many different forms and should not be construed as being limited to the embodiments set forth herein. Accompanying drawings are only exemplary drawings of the present disclosure, and may not be depicted according to a certain ratio. Like reference numerals in the drawings denote the same or like elements, and thus repetitive description thereof may be omitted.

In addition, the described features, structures, or characteristics may be combined in any suitable manner in one or more embodiments. In the following description, numerous specific details are given to provide a thorough understanding of embodiments of the present disclosure. Those skilled in the relevant art will recognize, however, that technical solutions of the present disclosure can be practiced without one or more of the specific details, or with other methods, components, devices, or steps, etc. In other instances, well-known technical, solutions are not shown or described in detail to avoid obscuring aspects of the present disclosure.

Figure 2:
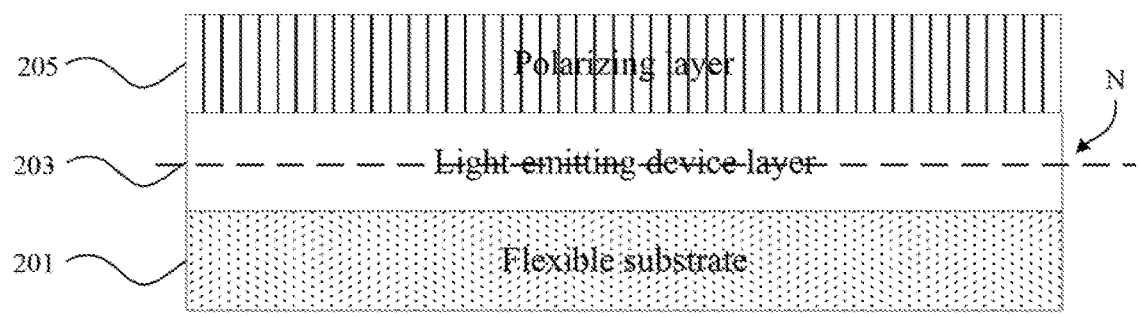
FIG. 2 illustrates an exemplary flexible display panel according to embodiments of the present disclosure.

FIG. 2 illustrates an exemplary flexible display panel according to embodiments of the present disclosure. The flexible display panel may include a stacked structure comprising a flexible substrate 201, a light-emitting device layer 203, and a polarizing layer 205 stacked sequentially. More specifically, the flexible substrate 201 may be used as a substrate to support the light-emitting device layer 203.

The light-emitting device layer 203 may include a plurality of light-emitting devices made of a light-emitting material, such as organic light-emitting diodes (OLEDs). By using an organic polymer material as the semiconductor material in the light-emitting diodes, the OLEDs may have advantages such as self-illumination, low power consumption, a fast response rate, and a wide viewing angle, etc. The polarizing layer 205 may include a polarizing plate and a compensation wavelength plate, etc.

The flexible display panel may further include at least one upper-side resistive force-sensitive electrode (not shown in FIG. 2) on any film or layer above a neutral plane (also called neutral layer or neutral surface) N of the stacked structure, and at least one lower-side resistive force-sensitive electrode (not shown in FIG. 2) on any film, or layer below the neutral plane N.

The neutral plane N of the stacked structure may refer to a surface, plane or layer that remains an initial length when the stacked structure bends. More specifically, when the stacked structure is bent due to press or an external force, the upmost layer may be in an inward-bent state, By then, one layer (i.e., the neutral plane N) may exist that remains an initial length. Each layer above the one layer may be in a compressed state, and each layer below the one layer may be in a stretched state (also called tensile state). Thus, the neutral plane N may be an inherent physical plane of the stacked structure, and when the stacked structure is bent, no stress may be applied on the neutral plane N.

For example, the position of the neutral plane N may be calculated according to the thickness of each layer and the Young's modulus. If the material of each layer is the same, the neutral plane N may be approximately located at a centroid position of the cross-section of the stacked structure. Many studies in the related art have been applied and explored to in determine the position of the neutral plane N, and the present disclosure is not intended to limit the specific method of determining the position of the neutral plane N.

Figure 3:
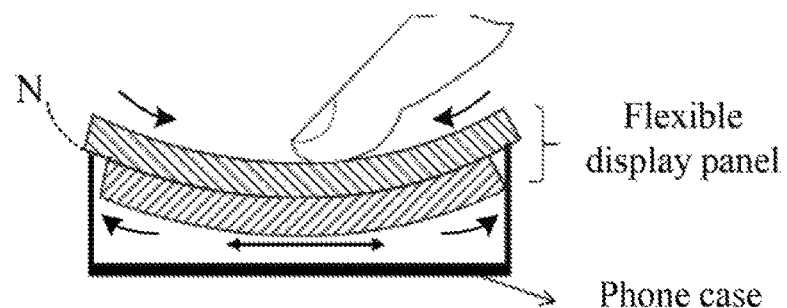
FIG. 3 illustrates an exemplary state of a flexible display panel under stress according to embodiments of the present disclosure.

Hereinafter, the principles of the flexible display panel provided by embodiments of the present disclosure are described in detail. When the disclosed flexible display panel is applied to an electronic device such as a cell-phone, etc, a bendable electronic device may be obtained. FIG. 3 illustrates an exemplary state where a flexible display panel is under stress according to embodiments of the present disclosure. As shown in FIG. 3, the flexible display panel may be applied to a phone with a phone case. When a finger of a user presses the flexible display panel, the flexible display panel may be bent.

When the flexible display panel is bent, each layer above the neutral plane N may receive a compressive stress, and each layer below the neutral plane N may receive a tensile stress. The resistive force-sensitive electrode included in the flexible display panel may be configured to sense a user force. For example, the resistance difference sensed by a plurality of resistive force-sensitive electrodes may be used to determine the user force.

Figure 4:
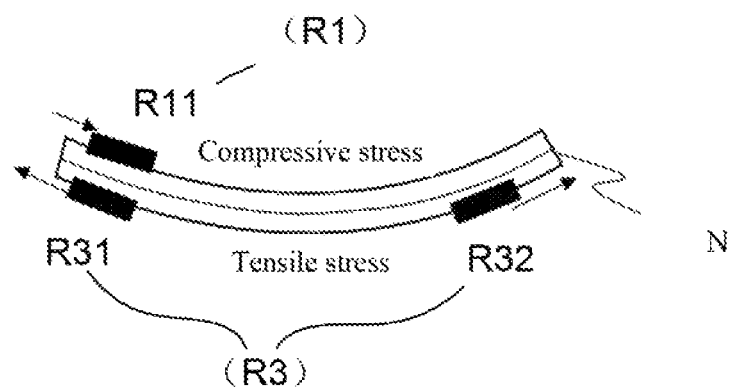
FIG. 4 illustrates an exemplary arrangement of resistive force-sensitive electrodes according to embodiments of the present disclosure.

FIG. 4 illustrates an exemplary arrangement of resistive force-sensitive electrodes according to embodiments of the present disclosure. As shown in FIG. 4, an upper-side resistive force-sensitive electrode R1 may be disposed on a layer above the neutral plane N and include a first resistive force-sensitive electrode R11. A lower-side resistive force-sensitive electrode R3 may be disposed on a layer below the neutral plane N and include a third resistive force-sensitive electrode R31 and a fourth resistive force-sensitive electrode R32.

Because the signal sensed by the first resistive force-sensitive R11 may be a compressive stress signal, and the signal sensed by the third and fourth resistive force-sensitive electrode R31 and R32 may be a tensile stress signal. Accordingly, the difference in the resistance sensed by the first resistive force-sensitive electrode R11 and the third and fourth resistive force-sensitive electrodes R31 and R32 increases, thereby improving the force-sensing sensitivity.

Further, in the disclosed flexible display panel, the plurality of resistive force-sensitive electrodes may be disposed on certain layers of the stacked structures. Accordingly, the total thickness of the stacked structure may not be increased, and the flexibility of the flexible display panel may be improved. Further, in the disclosed flexible display panel, no additional sensor film or force-sensitive coil is needed, thereby reducing the cost and simplifying the stacked structure. The present disclosure, however, is not intended to limit the number of the upper-side resistive force-sensitive electrodes and the number of the lower-side resistive force-sensitive electrodes.

Further, the number of electrodes included in the upper-side resistive force-sensitive electrode or the lower-side resistive force-sensitive electrode is also not limited thereto. For example, the umber of the electrodes included in the upper-side resistive force-sensitive electrode and the number of the electrodes included in the lower-side resistive force-sensitive electrode may be the same or may be different.

Figure 5:
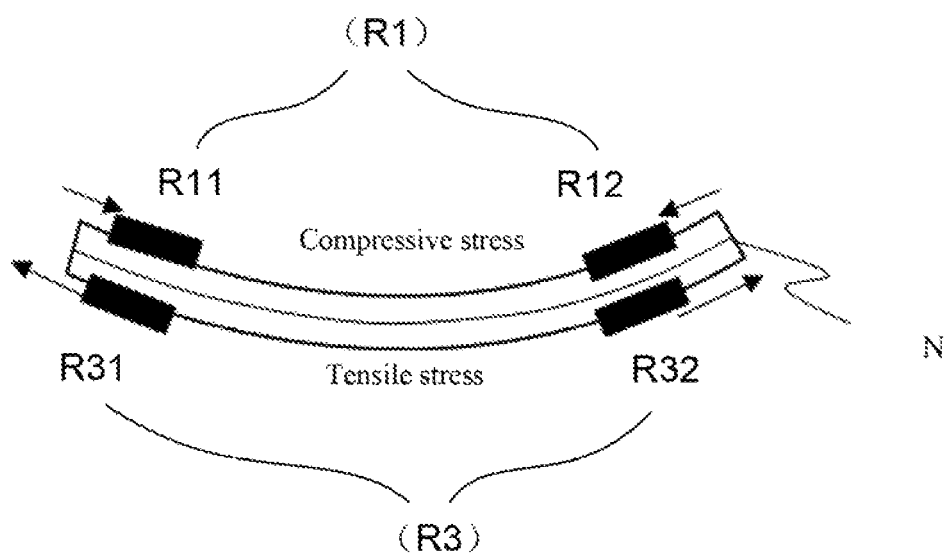
FIG. 5 illustrates another exemplary arrangement of resistive force-sensitive electrodes according to embodiments of the present disclosure.

FIG. 5 illustrates another exemplary arrangement of resistive force-sensitive electrodes according to embodiments of the present disclosure. As shown, in FIG. 5, the upper-side resistive force-sensitive electrode R1 disposed above the neutral plane N may include the first resistive force-sensitive electrode R11 and a second resistive force-sensitive electrode R12. The lower-side resistive force-sensitive electrode R3 disposed below the neutral plane N may include the third resistive force-sensitive electrode R31 and the fourth resistive force-sensitive electrode R32.

Figure 6:
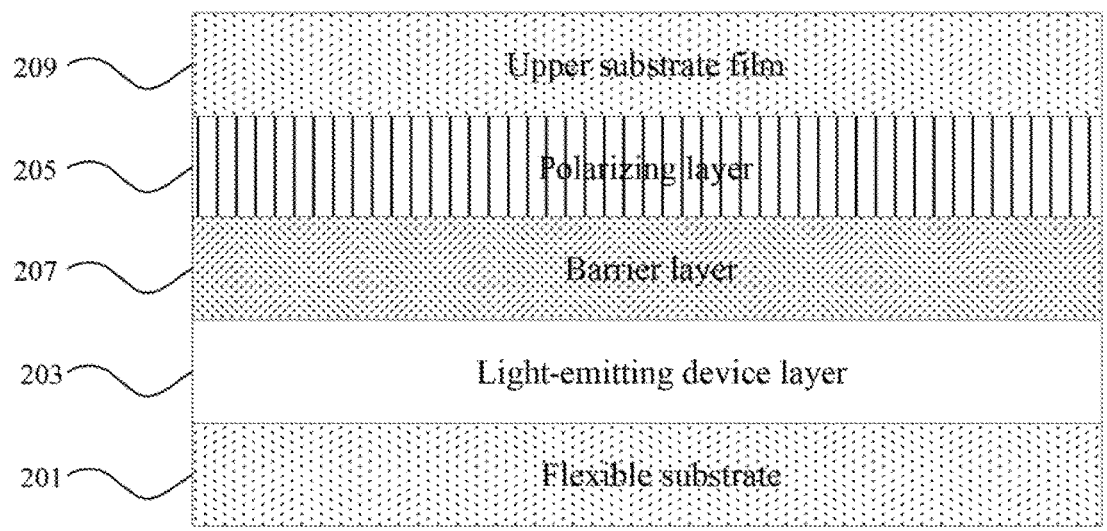
FIG. 6 illustrates another exemplary flexible display panel according to embodiments of the present disclosure.

FIG. 6 illustrates another exemplary flexible display panel according to embodiments of the present disclosure. In one embodiment, as shown in FIG. 6, the stacked structure may include a flexible substrate 201, a light-emitting device layer 203 disposed on the flexible substrate 201, and a polarizing layer 205 disposed above the light-emitting device layer 203. The stacked structure may further include a barrier layer 207 and an upper, substrate film 209. The barrier layer 207 may be sandwiched between the light-emitting device layer 203 and the polarizing layer 205, and the upper substrate film 209 may be disposed on the polarizing layer 205.

In the flexible display panel illustrated in FIG. 6, the neutral plane may be located in the polarizing layer 205, in the barrier layer 207, or between the polarizing layer 205 and the barrier layer 207. Based on the different positions of the neutral plane, the placement positions of the resistive force-sensitive electrodes may be different.

FIG. 7A-FIG. 7E illustrate other exemplary flexible display panels according to embodiments of the present disclosure. As shown in FIG. 7A-FIG. 7E, other than the difference in positions of resistive force-sensitive electrodes, the stacked structures of the disclosed flexible display panels are similar to each other. That is, the stacked structures, illustrated in FIG. 7A to FIG. 7E may each include a flexible substrate 201, a light-emitting device layer 203, a polarizing layer 205, a barrier layer 207, and an upper substrate film 209 stacked in the same manner as illustrated in FIG. 6, which is not repeatedly described here.

Figure 7A:
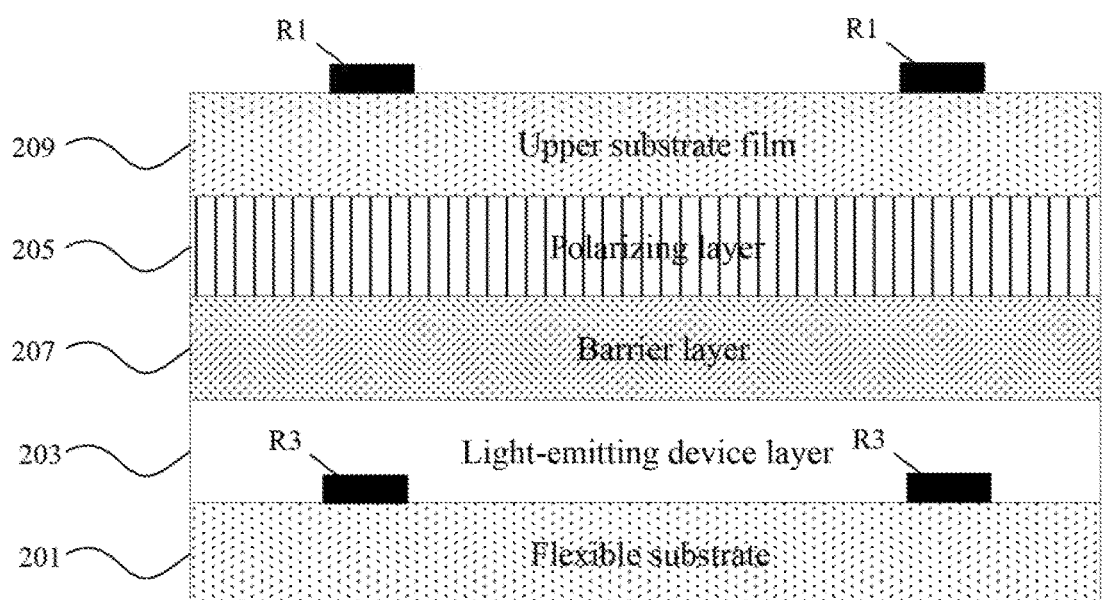
FIG. 7A illustrates another exemplary flexible display panel according to embodiments of the present disclosure.

Optionally, in some embodiments, at least one upper-side resistive force-sensitive electrode may be disposed on the upper substrate film 209, and at least one lower-side resistive force-sensitive electrode may be disposed on the flexible substrate 201. For example, as shown in FIG. 7A, two upper-side resistive force-sensitive electrodes R1 may be disposed on the upper substrate film 209, and two lower-side resistive force-sensitive electrodes R3 may be disposed on the flexible substrate 201.

Figure 7B:
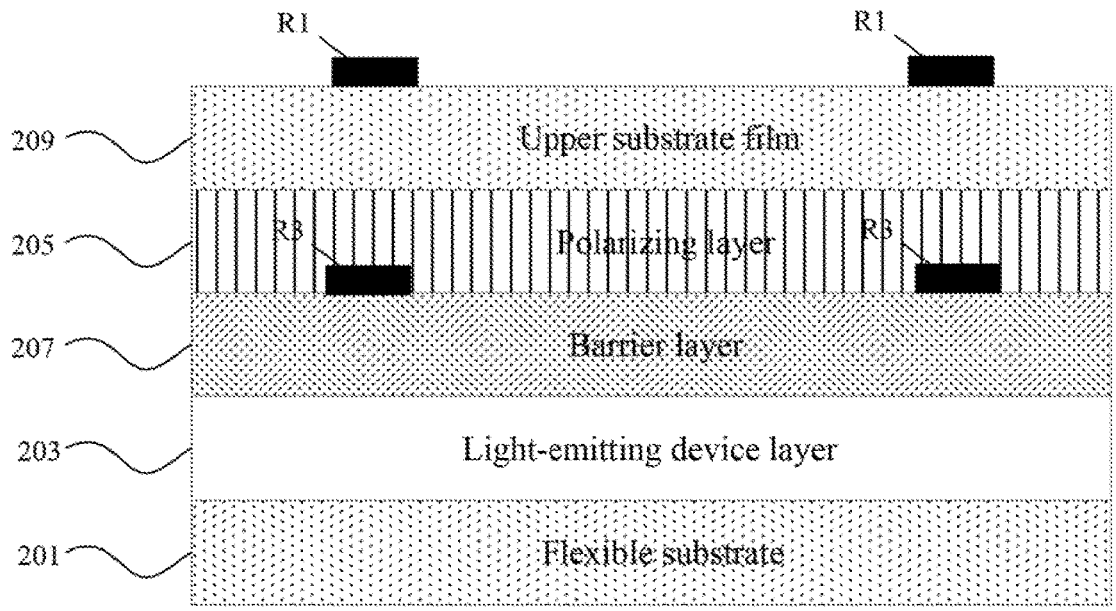
FIG. 7B illustrates another exemplary flexible display panel according to embodiments of the present disclosure.

Optionally, in some embodiments, at least one upper-side resistive force-sensitive electrode may be disposed on the upper substrate film 209, and at least one lower-side resistive force-sensitive electrode may be disposed on the barrier layer 207. For example, as shown in FIG. 7B, two upper-side resistive force-sensitive electrodes R1 may be disposed on the upper substrate film 209, and two lower-side resistive force-sensitive electrodes R3 may be disposed on the barrier layer 207.

Figure 7C:
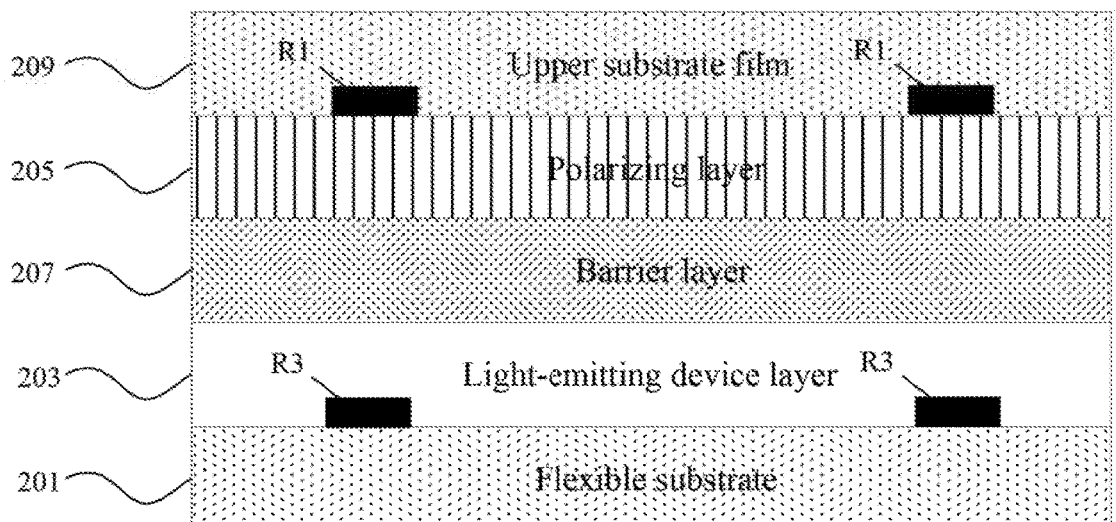
FIG. 7C illustrates another exemplary flexible display panel according to embodiments of the present disclosure.

Optionally, in some embodiments, at least one upper-side resistive force-sensitive electrode may be disposed on the polarizing layer 205, and at least one lower-side resistive force-sensitive electrode may be disposed on the flexible substrate 201. For example, as shown in FIG. 7C, two upper-side resistive force-sensitive electrodes R1 may be disposed on the polarizing layer 205, and two lower-side resistive force-sensitive electrodes R3 may be disposed on the flexible substrate 201.

Figure 7D:
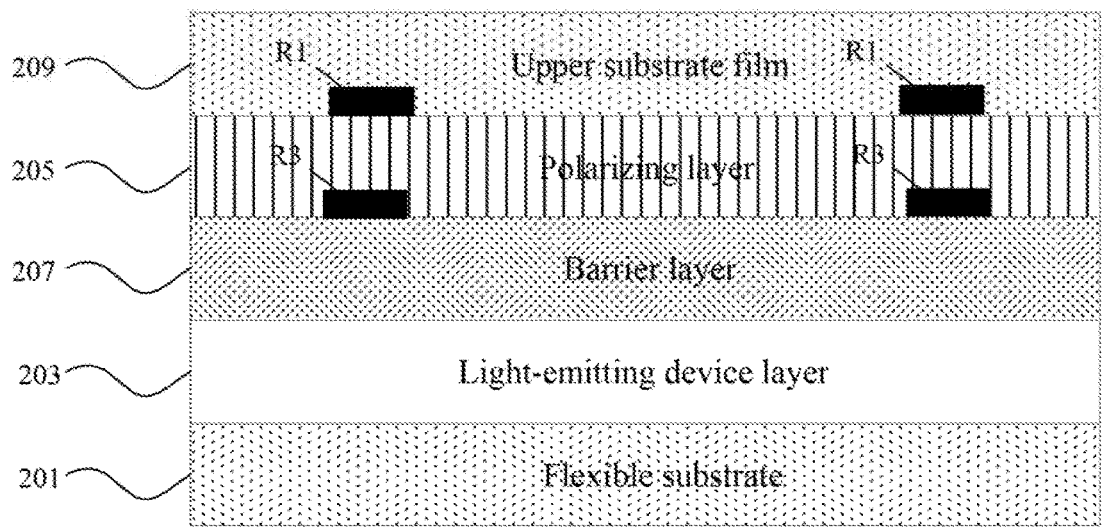
FIG. 7D illustrates another exemplary flexible display panel according to embodiments of the present disclosure.

Optionally, in some embodiments, at least one upper-side resistive force-sensitive electrode may be disposed on the polarizing layer 205, and at least one lower-side resistive force-sensitive electrode may be disposed on the barrier layer 207. For example, as shown in FIG. 7D, two upper-side resistive force sensitive electrodes R1 may be disposed on the polarizing layer 205, and two lower-side resistive force-sensitive electrodes R3 may be disposed on the barrier layer 207.

Figure 7E:
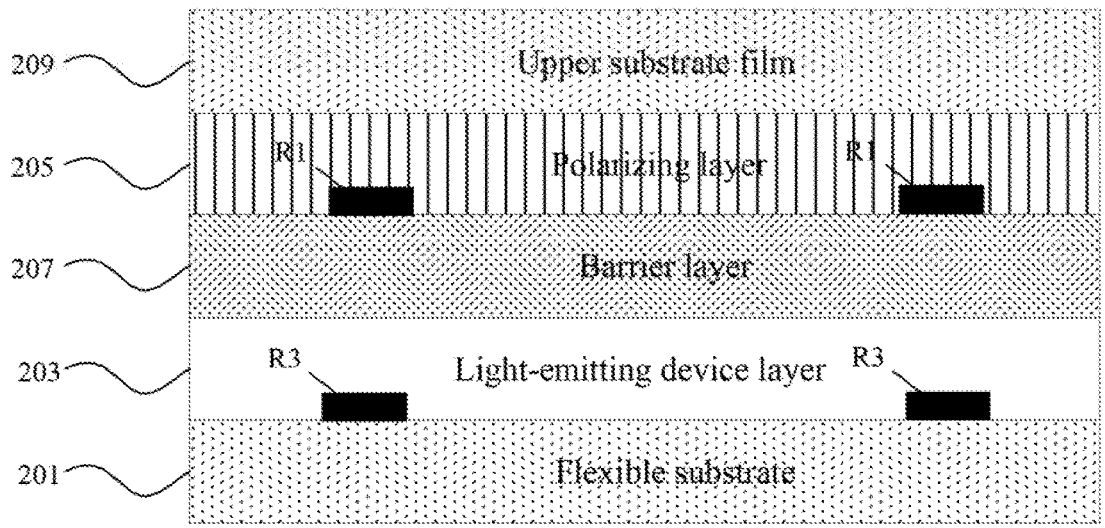
FIG. 7E illustrates another exemplary flexible display panel according to embodiments of the present disclosure.

Optionally, in some embodiments, at least one upper-side resistive force-sensitive electrode may be disposed on the barrier layer 207, and at least one lower-side resistive force-sensitive electrode may be disposed on the flexible substrate 201. For example, as shown in FIG. 7E, two upper-side resistive force-sensitive electrodes R1 may be disposed on the barrier layer 207, and two lower-side resistive force-sensitive electrodes R3 may be disposed on the flexible substrate 201.

Further, each layer may be adhered to each other via a pressure-sensitive adhesive (PSA). Optionally, the uppermost layer and the lowermost layer of the stacked structure may be protected by attachment of a protection film.

Figure 8:
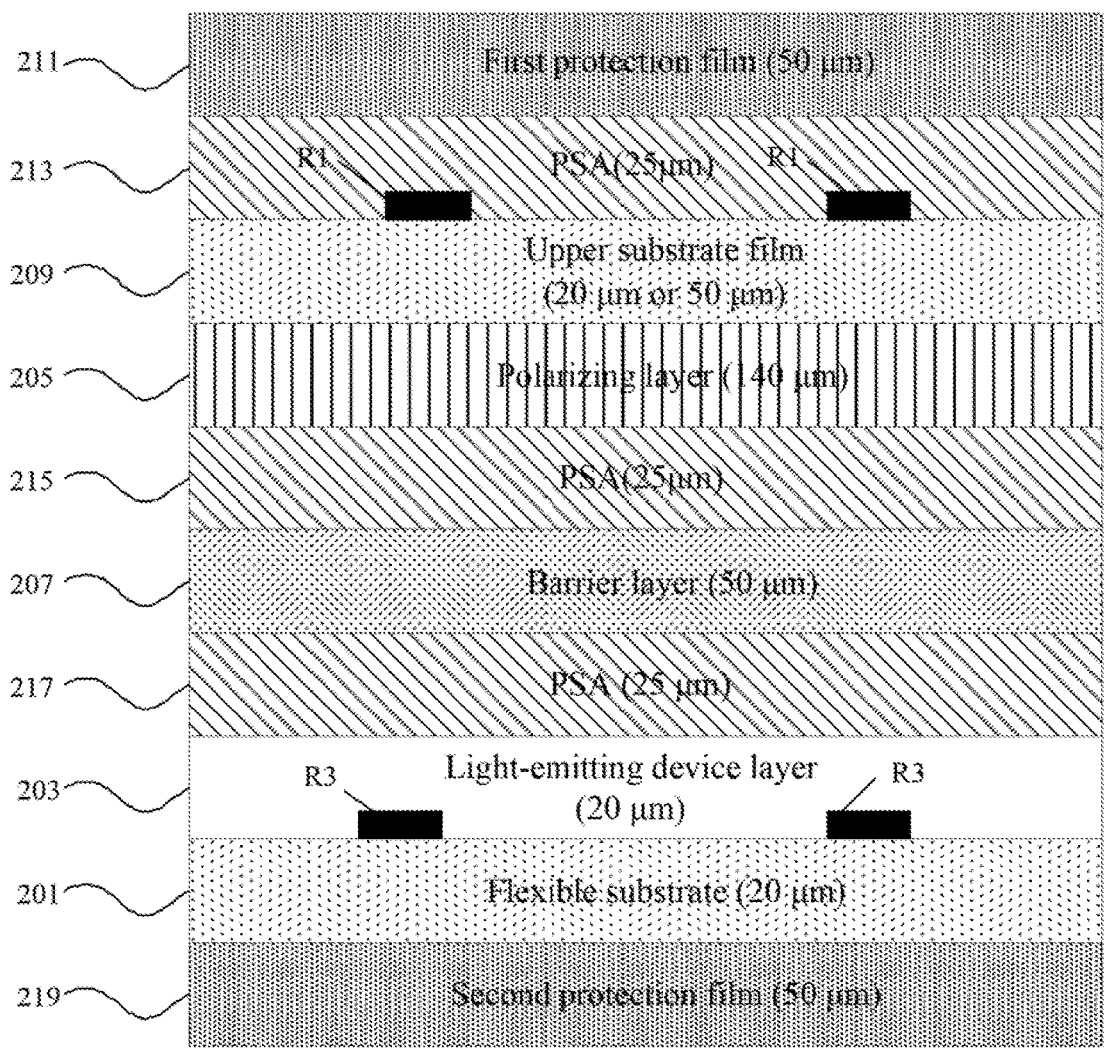
FIG. 8 illustrates another exemplary flexible display panel according to embodiments of the present disclosure.

FIG. 8 illustrates another exemplary flexible display panel according to embodiments of the present disclosure. As shown in FIG. 8, based on the stacked structure illustrated in FIG. 6, a PSA 213 and a first protection film 211 may be disposed above the upper substrate film 209, the polarizing layer 205 and the barrier layer 207 may be adhered via a PSA 215, and the barrier layer 207 and the light-emitting device layer 203 may be adhered via a PSA 217. Further, a second protection film 219 may be formed below the flexible substrate 201.

The first protection film 211 and the second protection film 219 may be made of a material such as a heat-resistant polyethylene terephthalate (PET), a cycio olefins polymer (COP), a polycarbonate (PC), a polyimide (PI), a polyethylene naphthalate (PEN), or a polyarylate (PAR), etc. Further, the thickness of the first protection film 211 and the second protection film 219 may be approximately 1-1000

μm. For example, the thickness of the first protection film and the second protection film may be approximately 50 μm.

The PSA 213 and the PSA 215 may be made of a material such as acrylic, silicon, polyolefin, rubber, etc. The thickness of the PSA 213 and the PSA 215 may be approximately 1-1000 μm. For example, in one embodiment, the thickness of the PSA 213 and the PSA 215 may be approximately 25 μm.

The upper substrate film 209 may be made of PI or PET. When the upper substrate film 209 is made of PI, the thickness of the upper substrate film 209 may be, for example, 25 μm. When the upper substrate film 209 is made, of PET, the thickness of the upper substrate film 209 may be, for example, 50 μm.

Further, the thickness of the polarizing layer 205 may be, for example, 140 μm. The barrier layer 207 may be made of a material that prevents the damage of the light-emitting device caused by water and oxygen invading the stacked structure. The thickness of the barrier layer 207 may be, for example, 50 μm.

Further, the light-emitting device layer 203 may be made of a light-emitting material, and the thickness of the light-emitting device layer 203 may be, for example, 20 μm. The flexible substrate 201 may be, for example, made of polyimide (PI), and the thickness of the flexible substrate 201 may be, for example, 20 μm.

A neutral plane of the stacked structure may be located between the polarizing layer 205 and the barrier layer 207. Two first resistive force-sensitive electrodes (i.e., two R1) may be disposed on the upper substrate film 209, and two second resistive force-sensitive electrodes (i.e., two R3) may be disposed on the flexible substrate 201. Via the difference in the resistance sensed by the first and second resistive force-sensitive electrodes, the force or pressure received by the flexible display panel may be determined.

FIG. 8 illustrates an example of the thickness of each layer included in the stacked structure of the disclosed flexible display panel. However, those skilled in the art should understand that the flexible display panels are not limited to the thickness and the material disclosed by the present disclosure. The thickness and material of each layer may be configured according to actual demands.

Figure 9:
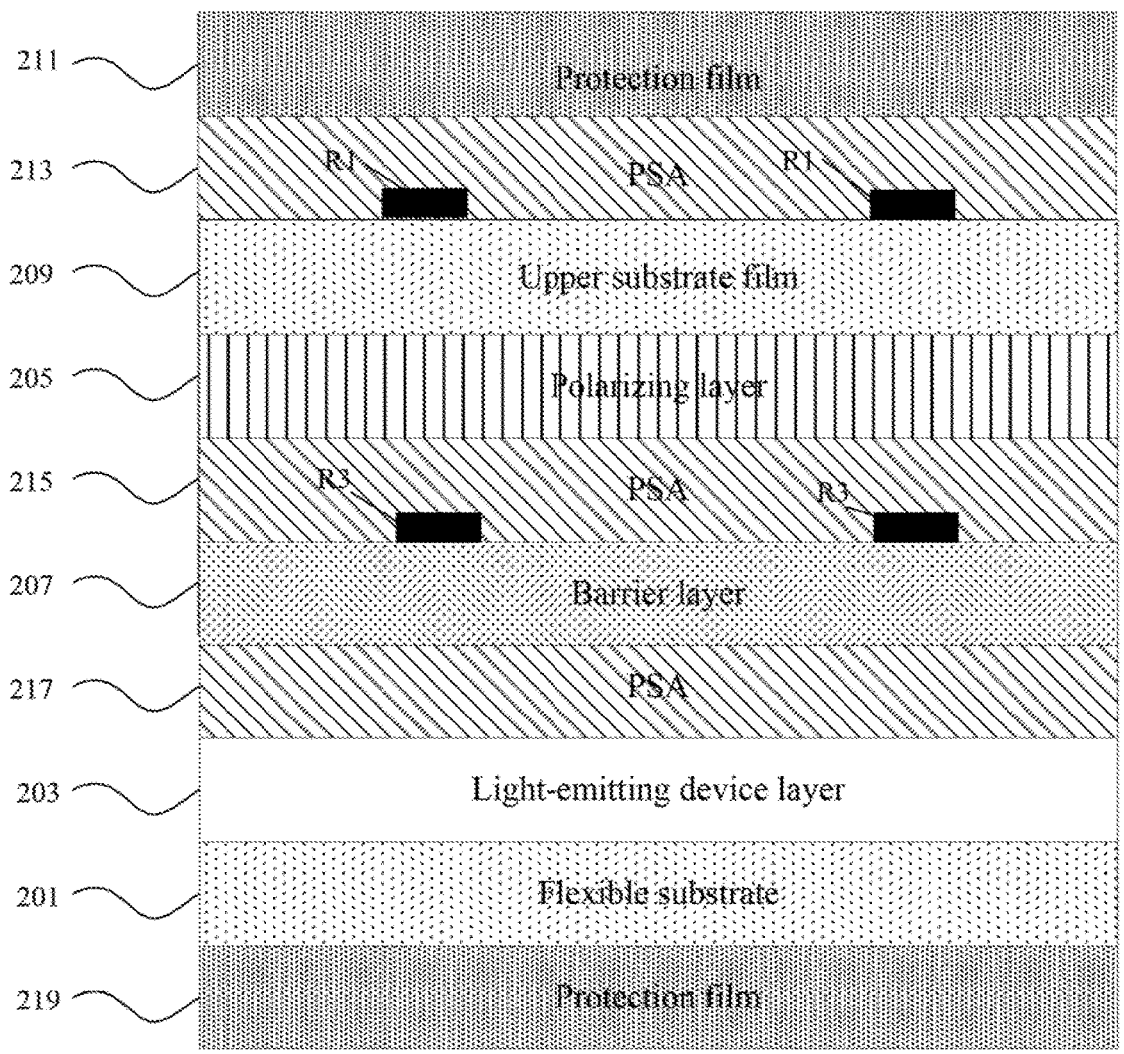
FIG. 9 illustrates another exemplary flexible display panel according to embodiments of the present disclosure.

FIG. 9 illustrates another exemplary flexible display panel according to embodiments of the present disclosure. Optionally, the neutral plane of the stacked structure may be located between the barrier layer 207 and the polarizing layer 205, or in the polarizing layer 205. Different from the stacked structure illustrated in FIG. 8, as shown in FIG. 9, two first resistive force-sensitive electrodes R1 may be disposed on the upper substrate film 209, and two second resistive force-sensitive electrodes R3 may be disposed on the barrier layer 207.

Figure 10:
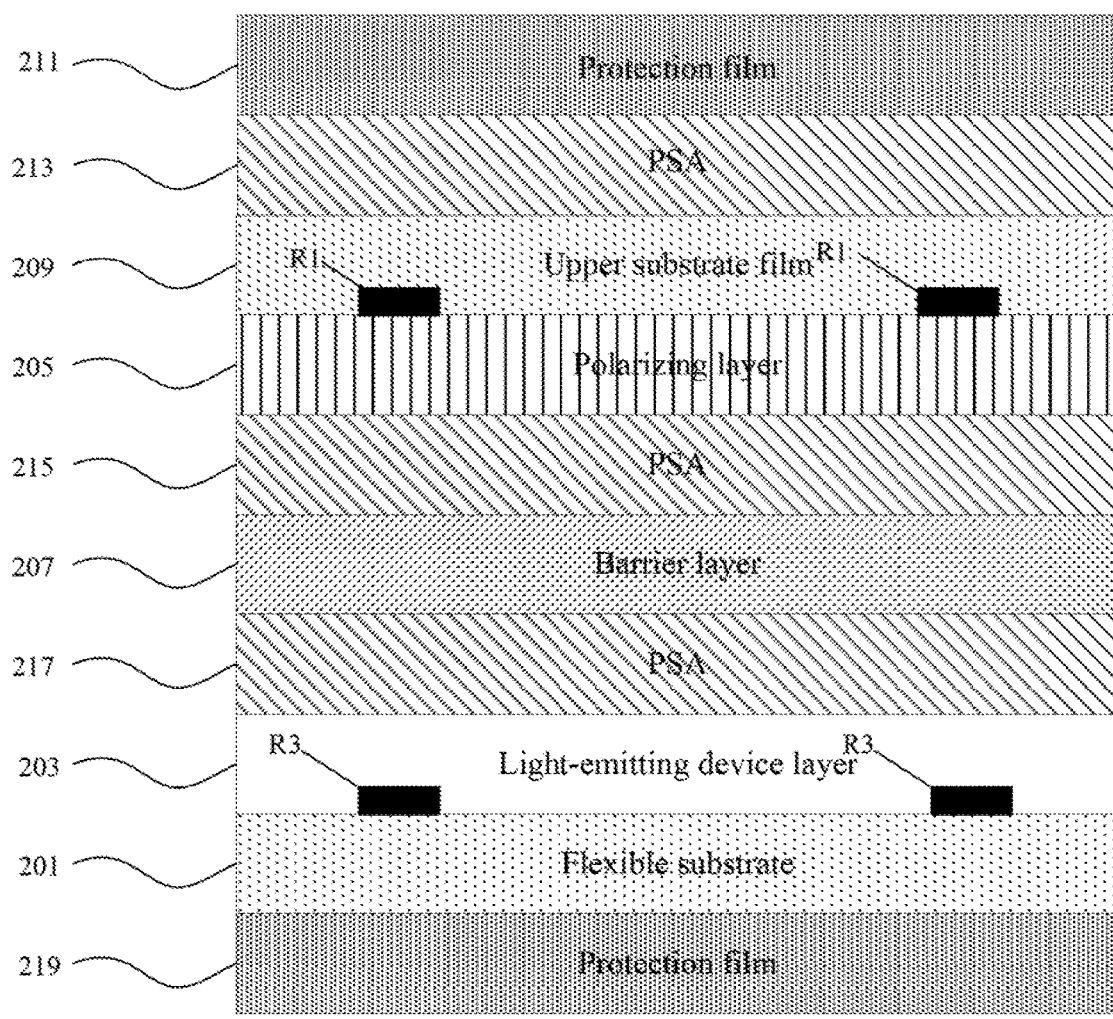
FIG. 10 illustrates another exemplary flexible display panel according to embodiments of the present disclosure.

FIG. 10 illustrates another exemplary flexible display panel according to embodiments of the present disclosure. Optionally, the neutral plane of the stacked structure may be located between the polarizing layer 205 and the barrier layer 207. Different from the stacked structure illustrated in FIG. 8, as shown in FIG. 10, two first resistive force-sensitive electrodes R1 may be disposed on the polarizing layer 205, and two second resistive force-sensitive electrodes R3 may be disposed on the flexible substrate 201.

Figure 11:
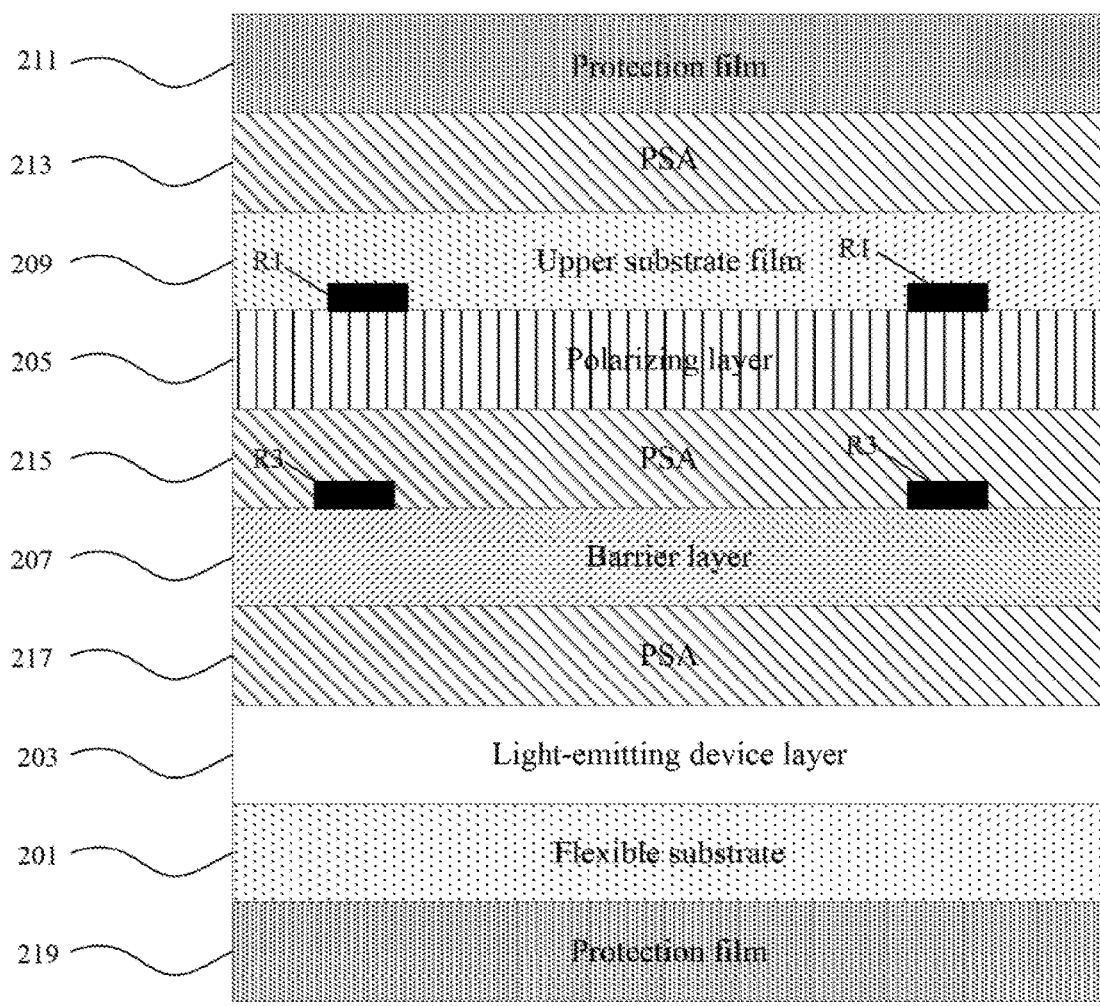
FIG. 11 illustrates another exemplary flexible display panel according to embodiments of the present disclosure.

FIG. 11 illustrates another exemplary flexible display panel according to embodiments of the present disclosure. Optionally, the neutral plane of the stacked structure may be located between the polarizing layer 205 and the barrier layer 207. Different from the stacked structure illustrated in FIG. 8, as shown in FIG. 9, two first resistive force-sensitive electrodes R1 may be disposed on the polarizing layer 205, and two second resistive force-sensitive electrodes R3 may be disposed on the barrier layer 207.

Figure 12:
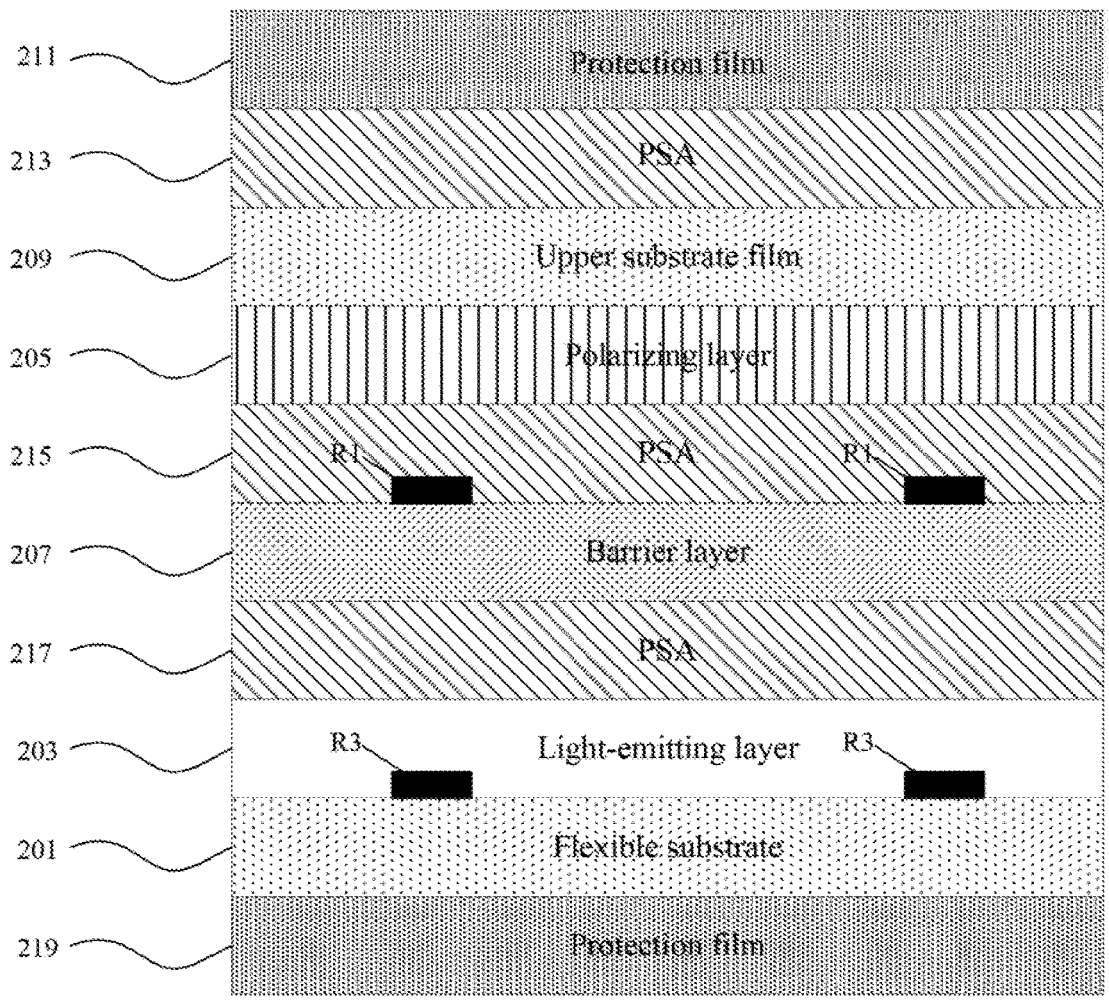
FIG. 12 illustrates another exemplary flexible display panel according to embodiments of the present disclosure.

FIG. 12 illustrates another exemplary flexible display panel according to embodiments of the present disclosure. Optionally, the neutral plane of the stacked structure may be located in the barrier layer 207. Different from the stacked structure illustrated in FIG. 8, as shown in FIG. 12, two first resistive force-sensitive electrodes R1 may be disposed on the barrier layer 207, and two second resistive force-sensitive electrodes R3 may be disposed on the flexible substrate 201.

Figure 13:
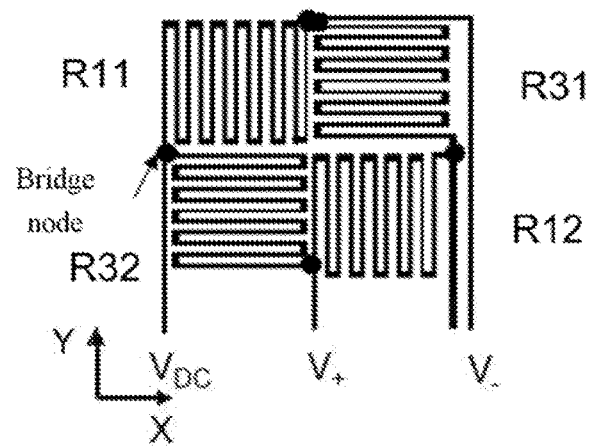
FIG. 13 illustrates an exemplary structure of resistive force-sensitive electrodes in a flexible display panel according to embodiments of the present disclosure.
Figure 14:
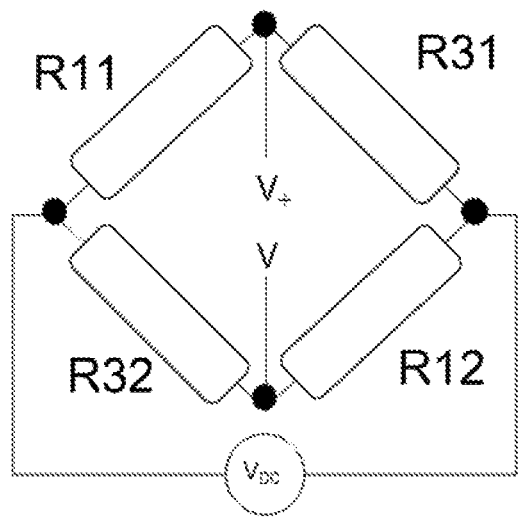
FIG. 14 illustrates an exemplary equivalent circuit diagram of a bridge structure formed by resistive force-sensitive electrodes in a flexible display panel according to embodiments of the present disclosure.

In some embodiments, a plurality of resistive force-sensitive electrodes may form a bridge circuit. FIG. 13 illustrates an exemplary structure of resistive force-sensitive electrodes in a flexible display panel according to embodiments of the present disclosure. FIG. 14 illustrates an exemplary equivalent circuit diagram of an electrode ridge structure formed by resistive force-sensitive electrodes in a flexible display panel according to embodiments of the present disclosure.

As shown in FIG. 13 and FIG. 14, each upper-side resistive force-sensitive electrode may include a first resistive force-sensitive electrode R11 and a second resistive force-sensitive electrode R12. Further, each lower-side resistive force-sensitive electrode may include a third resistive force-sensitive electrode R31 and a fourth resistive force-sensitive electrode R32. For ease of illustration, FIG. 13 and FIG. 14 only illustrate four electrodes.

Further, the first resistive force-sensitive electrode R11, the second resistive force-sensitive electrode R12, the third resistive force-sensitive electrode R31, and the fourth resistive force-sensitive electrode R32 may be electrically connected to form a bridge circuit. More specifically, one end of the first resistive force-sensitive electrode R11 may be electrically connected to one end of the third resistive force-sensitive electrode R31. One end of the second resistive force-sensitive electrode R12 may be electrically connected to one end of the fourth resistive force-sensitive electrode R32. Another end of the first resistive force-sensitive electrode R11 may be electrically connected to another end of the fourth resistive force-sensitive electrode R32. Another end of the third resistive force-sensitive electrode R31 may be electrically connected to another end of the second resistive force-sensitive electrode R12.

A connection node between the first resistive force-sensitive electrode R11 and the third resistive force-sensitive electrode R31 may be connected to one of the positive and negative terminals V+ and V−, and a connection node between the second resistive force-sensitive electrode R12 and the fourth resistive force-sensitive electrode R32 may be connected to the other one of the positive and negative terminals V+ and V−.

That is, optionally, the connection node between the first resistive force-sensitive electrode R11 and the third resistive force-sensitive electrode R31 may be connected to the positive terminal V+, and the connection node between the second resistive force-sensitive electrode R12 and the fourth resistive force-sensitive electrode R32 may be connected to the negative terminal V−.

Optionally, the connection node between the first resistive force-sensitive electrode R11 and the third resistive force-sensitive electrode R31 may be connected to the negative terminal V−, and the connection node between the second resistive force-sensitive electrode R12 and the fourth resistive force-sensitive electrode R32 may be connected to the positive terminal V+.

Further, a connection node between the first resistive force-sensitive electrode R11 and the fourth resistive force-sensitive electrode R32 may be connected to a first voltage terminal $V_{DC}$. A connection node between the third resistive force-sensitive electrode R31 and the second resistive force-sensitive electrode R12 may be connected to a second voltage terminal. The second voltage terminal may refer to, for example, ground, or other voltage terminals. Optionally, the connection node between the third resistive force-sensitive electrode R31 and the second resistive force-sensitive electrode R12 may also be connected to the first voltage terminal $V_{DC}$.

Further, referring to FIG. 13, a first sensitive grid forming the first resistive force-sensitive electrode R11 and a second sensitive grid forming the second resistive force-sensitive electrode R12 may have the same wiring orientation along an X direction. Further, a third sensitive grid forming the third resistive force-sensitive electrode R31 and a fourth sensitive grid forming the fourth resistive force-sensitive electrode R32 may have the same wiring orientation along a Y direction.

The bridge structure illustrated in FIG. 13 and FIG. 14 may be configured to sense a force applied on the flexible display panel and overcome the influence of thermal effect on the force sensing, thereby further improving the sensitivity.

According to the present disclosure, each upper-side resistive force-sensitive electrode may include two electrodes, and each lower-side resistive force-sensitive electrode may include two electrodes. The four electrodes may form a bridge structure via electrical connection. That is, the electrodes disposed on layers above and below the neutral plane may form a plurality of bridge structures to sense the force received by the flexible display panel.

In one embodiment, the first, second, third, and fourth resistive force-sensitive electrodes R11, R12, R31, and R32 may each be formed by a sensitive grid. The sensitive grid may be a grid pattern made of a metallic resistance wire, and is a core component of a strain gauge. Two ends of the sensitive grid may be each welded with a wire. In one embodiment, the first, second, third, and fourth resistive force-sensitive electrodes R11, R12, R31, and R32 may each be formed by a first, second, third and fourth sensitive grid, respectively.

FIG. 15(A) to FIG. 15(D) illustrate exemplary configurations of a wirings orientation of each sensitive grid and an extension direction of each wire coupled to the sensitive grid according to embodiments of the present disclosure. As shown in 15(A), each structure enclosed by a dashed box is a sensitive grid. More specifically, a first sensitive grid may form the first resistive force-sensitive electrode R11, and a second sensitive grid may form the second resistive force-sensitive electrode R12. Two ends of the first sensitive grid may be welded to first wires L1, and two ends of the second sensitive grid may be welded to second wires L2.

Figure 15A:
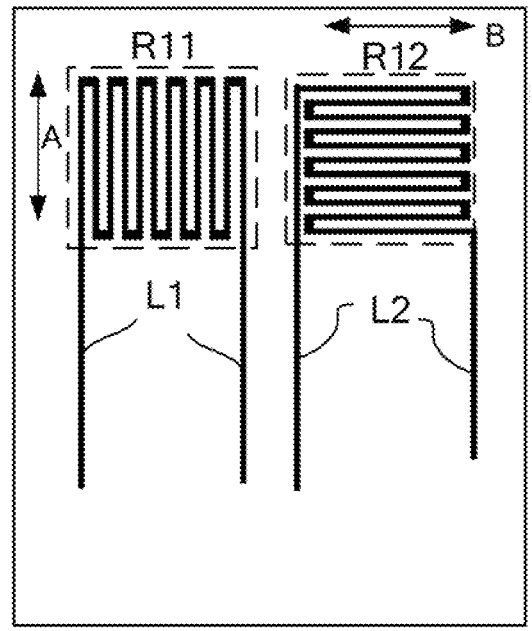
FIG. 15(A) to FIG. 15(D) illustrate exemplary configurations of a wiring orientation of each sensitive grid and an extension direction of each wire according to embodiments of the present disclosure.

Further, a wiring orientation of the first sensitive grid forming the first resistive force-sensitive electrode R11 may be a perpendicular direction (indicated by an arrow A in FIG. 15(A)). A wiring orientation of the second sensitive grid forming the second resistive force-sensitive electrode R12 may be a horizontal direction (indicated by an arrow B in FIG. 15(A)). That is, the wiring orientations of the first sensitive grid and the second sensitive grid may be perpendicular. In some other embodiments, the wiring orientations of the first sensitive grid and the second sensitive grid may be parallel, or form a preset angle θ.

Figure 15B:
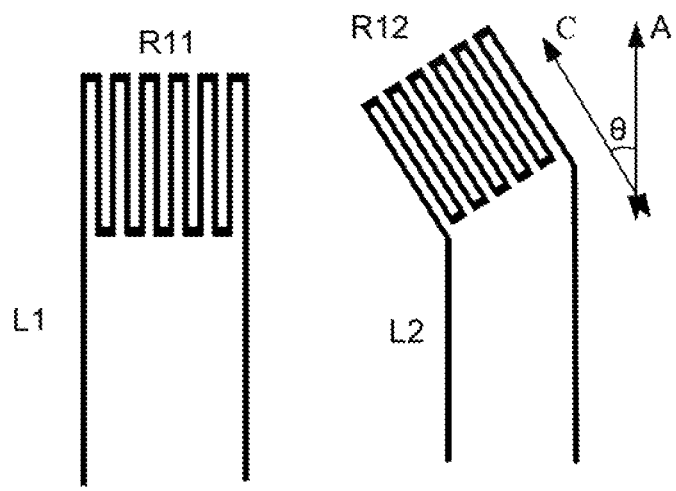

For example, as shown in FIG. 15(B), the wiring orientation of the first sensitive grid forming the first resistive force-sensitive electrode R11 may be indicated by the arrow A, and the wiring orientation of the second sensitive grid forming the second resistive force-sensitive electrode R12 may be indicated by an arrow C showing the preset angle θ with respect to the arrow A. That is, the wiring orientations of the first sensitive grid, and the second sensitive grid may form a preset angle θ. Similarly, the wiring orientations of the third sensitive grid and the fourth sensitive grid may be parallel, perpendicular, or form a preset angle.

Further, the wiring orientations of the first, second, third, and fourth sensitive grid may be parallel or perpendicular to, or form a preset angle with respect to the extension directions of the first, second, third, and fourth wires L1, L2, L3, and L4. As shown in FIG. 15(A), the wiring orientation of the first sensitive grid forming the first resistive force-sensitive electrode R11 may be a perpendicular direction (indicated by the arrow A) parallel to an extension direction of the first wires L1. The wiring orientation of the second sensitive grid forming the second resistive force-sensitive electrode R12 may be a horizontal direction (indicated by the arrow 13) perpendicular to an extension direction of the second wires L2.

In another embodiment, as shown in FIG. 15(B), the wiring orientation of the first sensitive grid may be indicated by the arrow A and be parallel to the extension direction of the first wires L1, and the wiring, orientation (indicated by the arrow C) of the second sensitive grid may form a preset angle θ with respect to the extension direction of the second wire L2. The range of the angle θ may be determined based on practical demands.

Figure 15C:
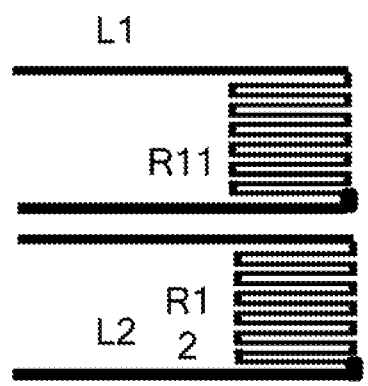
Figure 15C:
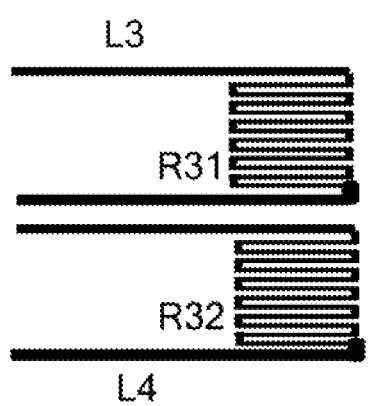

Further, in one embodiment, as shown in FIG. 15(C), the wiring orientation of the first sensitive grid forming the first resistive force-sensitive electrode R11 may be a horizontal direction, and be parallel to the extension direction of the first wires L1. The wiring orientation of the second sensitive grid forming the second resistive force-sensitive electrode R12 may be a horizontal direction, and be parallel to the extension direction of the second wires L2. The wiring orientation of the third sensitive grid forming the third resistive force-sensitive electrode R31 may be a horizontal direction, and be parallel to an extension direction of the third wires L3. The wiring orientation of the fourth sensitive grid forming the fourth resistive force-sensitive electrode R32 may also be a horizontal direction, and be parallel to an extension direction of the fourth wires L4. That is, the wiring orientations of the first, second, third, and fourth sensitive grid may all be a horizontal direction parallel to corresponding wires.

Figure 15D:
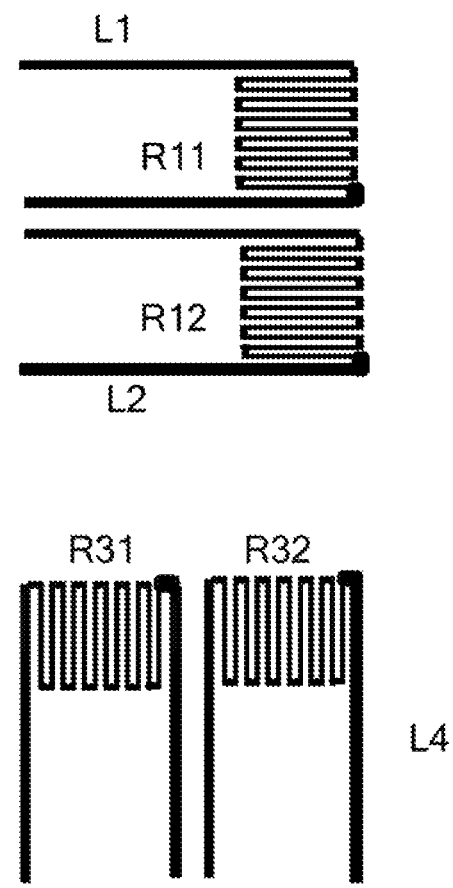

In another embodiment, as shown in FIG. 15(D), the wiring orientations of the first and second sensitive grids respectively forming the first and second resistive force-sensitive electrode R11 and R12 may be a horizontal direction, and be respectively parallel to the extension direction of the first and second wires L1 and L2. Further, the wiring orientations of the third and fourth sensitive grids respectively forming the third and fourth resistive force-sensitive electrode R31 and R32 may be a perpendicular direction, and be respectively parallel to the extension direction of the third and fourth wires L3 and L4. That is, the wiring orientations of the first, second, third, and fourth sensitive grid may all be parallel to corresponding wires.

By configuring the wiring orientations of the first, second, third, and fourth sensitive grid to be parallel to corresponding wires (i.e., L1, L2, L3, and L4), the interference of wiring resistance may be reduced. Further, the wiring orientations of the first sensitive grid and the second sensitive grid may be parallel (both are horizontal directions, as illustrated in FIG. 15(C) and FIG. 15(D) or perpendicular (the wiring orientation of the first sensitive grid is a perpendicular direction, and the wiring orientation of the second sensitive grid is a horizontal direction, as illustrated in FIG. 15(A)). The wiring orientations of the third sensitive grid and, the fourth sensitive grid may be parallel (e.g., both are horizontal directions, as illustrated in FIG. 15(C)), or perpendicular.

Figure 16:
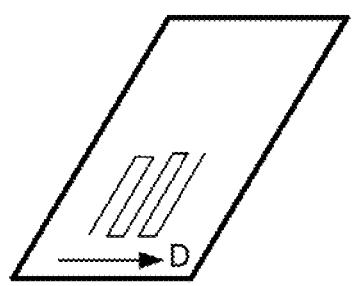
FIG. 16 illustrates an exemplary arrangement of a sensitive grid according to embodiments of the present disclosure.

FIG. 16 illustrates an exemplary arrangement of a sensitive grid according to embodiments of the present disclosure. As shown in FIG. 16, the wiring orientation of the sensitive grid (e.g., the first, second, third, or fourth sensitive grid) may be perpendicular to an extension direction (indicated by an arrow D in FIG. 16) of a short side of the flexible display panel. Because, the main stress may be parallel to a long side of the flexible display panel, the wiring orientation of the sensitive grid may be configured to be perpendicular to the short side (i.e., parallel to the long side) to maximize the stress difference. That is, the wiring orientations of each sensitive grid may be configured to be parallel to the long side, thereby increasing the resistance difference sensed by each electrode. Accordingly, the sensitivity may be further in improved.

Figure 17:
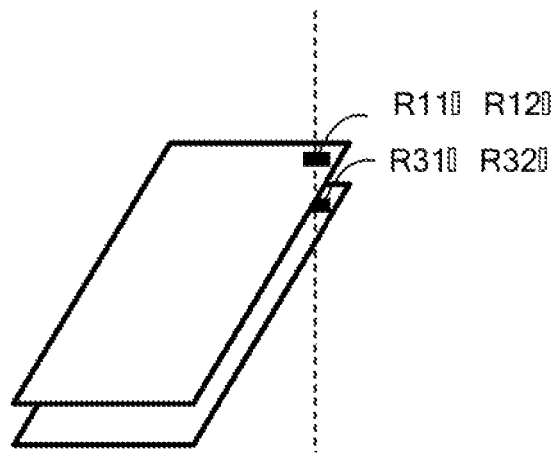
FIG. 17 illustrates another exemplary arrangement of a sensitive grid according to embodiments of the present disclosure.

FIG. 17 illustrates an exemplary arrangement of a sensitive grid according to embodiments of the present disclosure. In one embodiment, as shown in FIG. 17, each sensitive grid forming a corresponding resistive force-sensitive electrode may be disposed in corners of the flexible display panel. More specifically, the orthographic projections of the first resistive force-sensitive electrode R11 and the third resistive for e-sensitive electrode R31 on the flexible substrate may be coincided. Or, the orthographic projections of the second resistive force-sensitive electrode R12 and the fourth resistive force-sensitive electrode R32 on the flexible substrate may be coincided.

Figure 18:
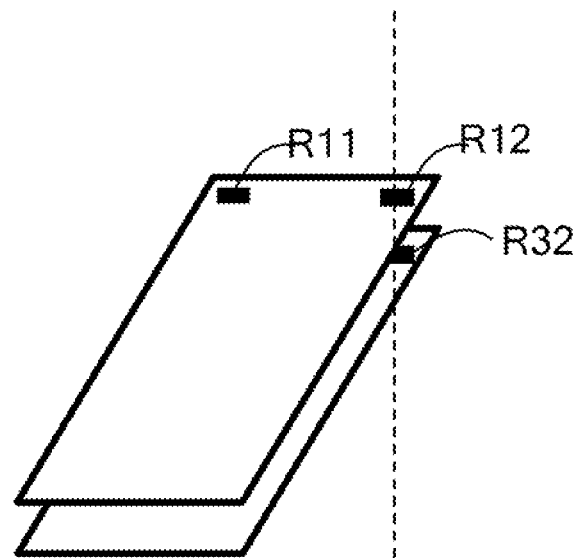
FIG. 18 illustrates another exemplary arrangement of a sensitive grid according to embodiments of the present disclosure.

FIG. 18 illustrates another exemplary arrangement of a sensitive grid according to embodiments of the present disclosure. As shown in FIG. 18, the orthographic projections of the first resistive force-sensitive electrode R11 and the third resistive force-sensitive electrode R31 on the flexible substrate may be coincided, and the orthographic projections of the second resistive force-sensitive electrode R12 and the fourth resistive force-sensitive electrode R32 on the flexible substrate may be coincided.

That is, the first resistive force-sensitive electrode R11 may correspond to a position of the third resistive force-sensitive electrode R32 along the stacking direction, and the second resistive force-sensitive electrode R12 may correspond to a position of the fourth resistive force-sensitive electrode along the stacking direction.

The arrangement method illustrated in FIG. 18 may allow the first resistive force-sensitive electrode R11 and the third resistive force-sensitive electrode R31 to be in the same temperature field, and allow the second resistive force-sensitive electrode R12 and the fourth resistive force-sensitive electrode R32 to be in the same temperature field. Accordingly, variations in the resistance of each resistive force-sensitive electrode caused by variation in the temperature may be the same, thereby reducing the impact of the temperature on the sensitivity.

Optionally, the orthographic projections of the first resistive force-sensitive electrode R11 and the third resistive force-sensitive electrode R31 on the flexible substrate may be staggered, as long as the position staggering amount between R11 and R31 is within a certain range. The orthographic projections of the second resistive force-sensitive electrode R12 and the fourth resistive force-sensitive electrode R32 on the flexible substrate may also be staggered, as long as the position staggering amount between R12 and R32 is within a certain range. Further, the position staggering amount between different electrodes may be determined according to practical demands, such as the fabrication process. The present disclosure not limited thereto.

In one embodiment, the first resistive force-sensitive electrode R11, the second resistive force-sensitive electrode R12, the third resistive force-sensitive electrode R31, and the fourth resistive force-sensitive electrode R32 may be made of Mo, Al, Cu, ITO, Ag, or other materials with a relatively small thermal effect (e.g., Cu—Ni alloy).

Figure 19:
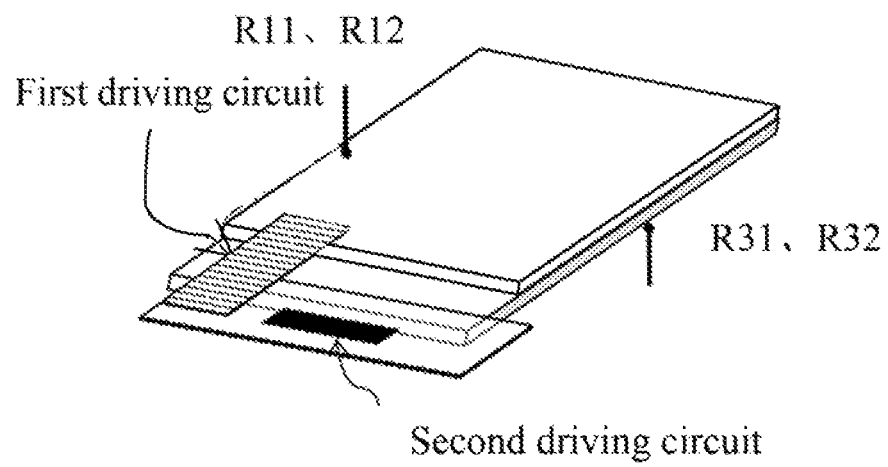
FIG. 19 illustrates an exemplary connection relationship of resistive force-sensitive electrodes in a flexible display panel according to embodiments of the present disclosure.

FIG. 19 illustrates an exemplary connection relationship of resistive force-sensitive electrodes in a flexible display panel according to embodiments of the present disclosure. As shown in FIG. 19, the flexible display panel may further include a first driving circuit and a second driving circuit. The first driving circuit may be electrically connected to the first resistive force-sensitive electrode R11 via the first wire L1 (illustrated in FIGS. 15(A)-15(D)), and electrically connected to the second resistive force-sensitive electrode R12 via the second wire L2 (illustrated FIGS. 15(A)-15(D).

Further, the second driving circuit may be electrically connected to the third resistive force-sensitive electrode R31 via the third wire L3 (illustrated in FIGS. 15(C)-15(D)), and electrically connected to fourth resistive force-sensitive electrode R32 via the fourth wire L4 (illustrated in FIGS. 15(C)-15(D)). Further the second driving circuit may be connected to the first driving circuit.

In particular, specific positions of each resistive force-sensitive electrode (not shown) may refer to aforementioned embodiments. The first driving circuit and the second driving circuit, may each be a flexible printed circuit (FPC) or an integrated circuit (IC), etc. The present disclosure is not limited thereto.

Assuming the resistance of the first wire L1 is $R_{line1}$, the resistance of the second wire L2 is $R_{line2}$, the resistance of the third wire 13 is $R_{line3}$, the resistance of the fourth wire L4 is and the resistance of each resistive force-sensitive electrode is $R_{sensor}$. Optionally, the resistance of each wire may be smaller than 10% of the resistance of the resistive force-sensitive electrode. That is, $R_{line1} < R_{sensor}*10\%$, $R_{line2} < R_{sensor}*10\%$, $R_{line3} < R_{sensor}*10\%$, and $R_{line4} < R_{sensor}*10\%$.

Figure 20:
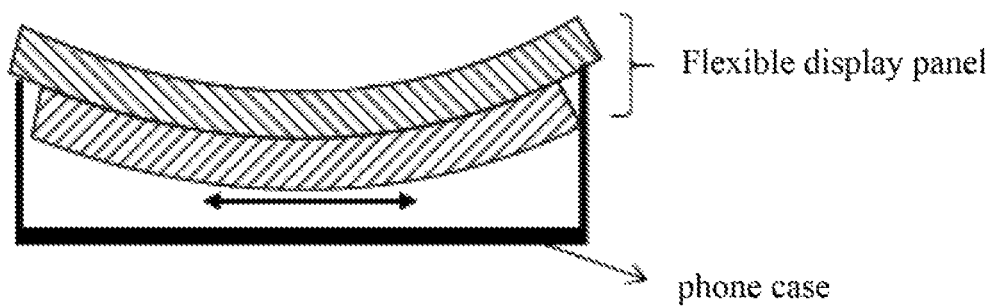
FIG. 20 illustrates a schematic view of an exemplary flexible display device according to embodiments of the present disclosure.

The present disclosure also provide a flexible display device. FIG. 20 illustrate a schematic view of an exemplary flexible display device according to embodiments of the present disclosure. As shown in FIG. 20, the flexible display device may be, for example, a phone, and the phone may include a phone case and a flexible display panel described in any aforementioned embodiment.

Figure 21:
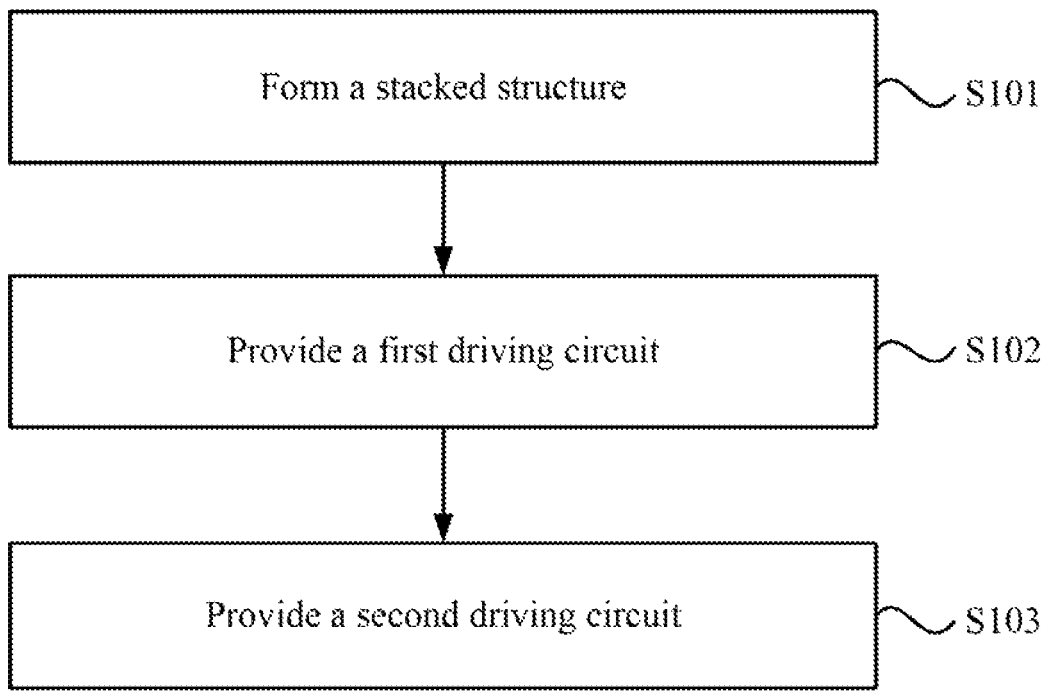
FIG. 21 illustrates a flu v chart of an exemplary fabrication method of a flexible display panel according to embodiments of the present disclosure.

Further, the present disclosure provides a fabrication method of aforementioned flexible display panels. FIG. 21 illustrates a flow chart of an exemplary fabrication method of a flexible display panel according to embodiments of the present disclosure.

As shown in FIG. 21, the fabrication method of the flexible panel may include forming a stacked structure (S101). More specifically, the stacked structure may include a flexible substrate, a light-emitting device layer, and a polarizing layer stacked sequentially. That is, the flexible substrate, the light-emitting device layer, and the polarizing layer may be disposed on a substrate sequentially, thereby forming the stacked structure.

Figure 22:
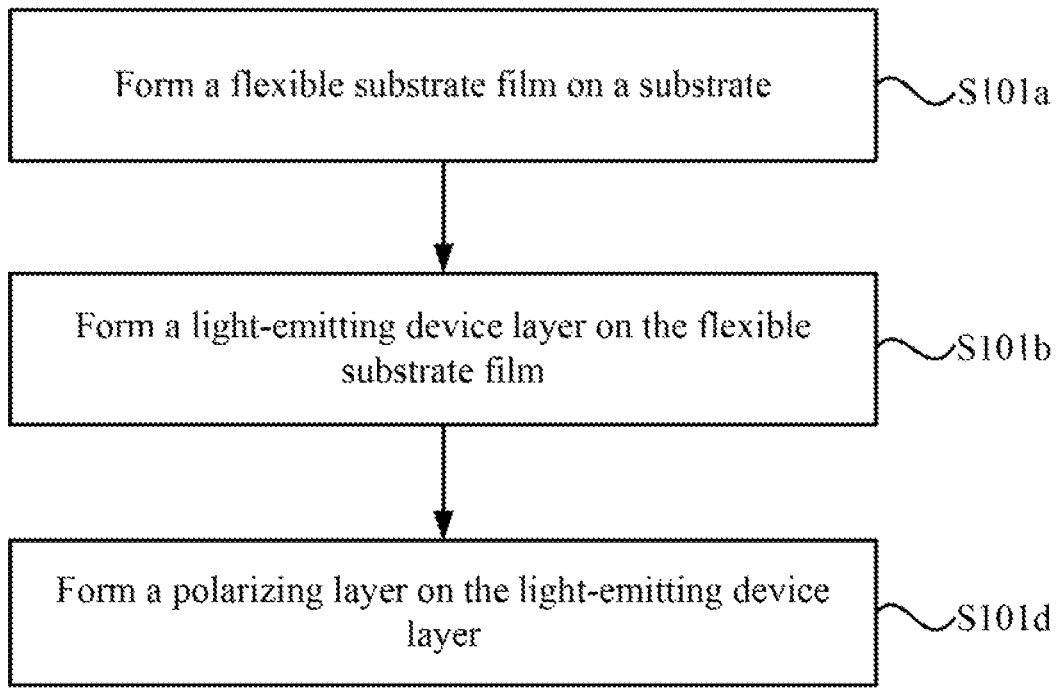
FIG. 22 illustrates a flow chart of an exemplary fabrication method of a stacked structure according to embodiments of the present disclosure.

FIG. 22 illustrates a flow chart of an exemplary fabrication method of a stacked structure according to embodiments of the present disclosure. As shown in FIG. 22, a method to form the stacked structure may include forming a flexible substrate on a substrate (S101a), forming a light-emitting device layer on the flexible substrate (S101b), and forming a polarizing layer above the light-emitting device layer (S101d).

Optionally, the stacked structure may further include forming at least one upper-side resistive force-sensitive electrode on any layer above a neutral plane of the stacked structure, and forming at least one lower-side resistive force-sensitive electrode on any layer below the neutral plane.

For example, during a process of forming the stacked structure, a first electrode material layer may be formed on any layer above the neutral plane of the stacked structure, and a first resistive force-sensitive electrode may be formed via a process such as etching, etc. Further, a second electrode material layer may be formed above any layer below the neutral plane, and at least one lower-side resistive force-sensitive electrode may be formed via a process such as etching, etc.

Figure 23:
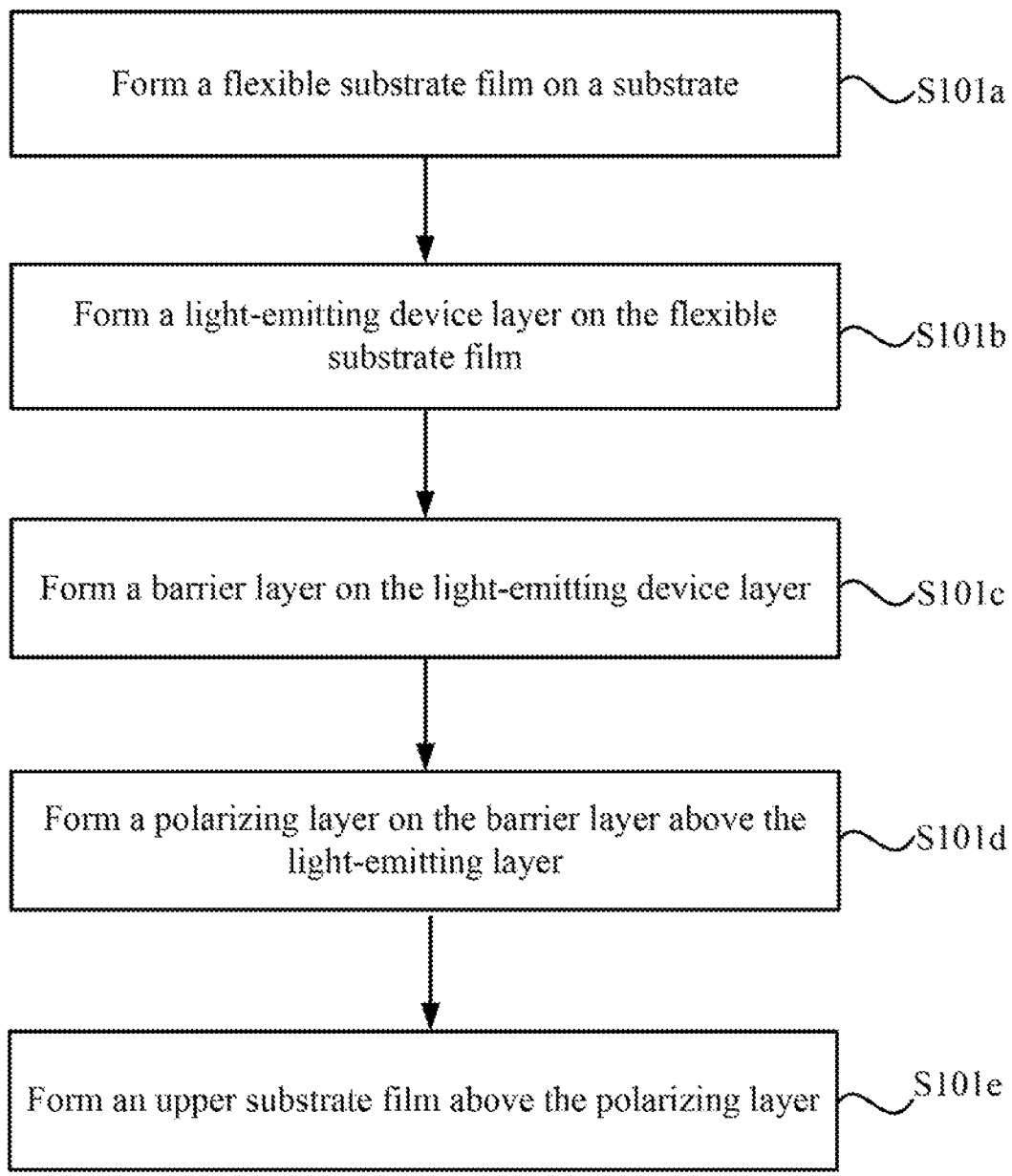
FIG. 23 illustrates a flow chart of another exemplary fabrication method of a stacked structure according to embodiments of the present disclosure.

FIG. 23 illustrates a flow chart of another exemplary fabrication method of a stacked structure according to embodiments of the present disclosure. As shown in FIG. 23, in one embodiment, a process of forming the stacked structure may further include forming a barrier layer between the light-emitting device layer and the polarizing layer (S101c), and forming an upper substrate film above the polarizing layer (S101e).

Optionally, the neutral plane may be located in the polarizing layer, in the barrier layer, or between the polarizing layer and the barrier layer. For example, at least one upper-side resistive force-sensitive electrodes may be formed on the upper substrate film, and at least one lower-side resistive force-sensitive may be formed on the flexible substrate. Optionally, at least one upper-side resistive force-sensitive may be formed on the upper substrate film, and at least one lower-side resistive force-sensitive electrodes may be formed on the barrier layer.

Optionally, at least one upper-side resistive force-sensitive electrode may be formed on polarizing layer, and at least one lower-side resistive force-sensitive electrode may be formed on the flexible substrate. Optionally, at least one upper-side resistive force-sensitive electrode may be formed on polarizing layer, and at least one lower-side resistive force-sensitive electrode may be formed on the barrier layer. Optionally, at least one upper-side resistive force-sensitive electrode may be formed on the barrier layer, and at least one lower-side resistive force-sensitive electrode may be formed on the flexible substrate.

In one embodiment, each upper-side resistive force-sensitive electrode may include a first resistive force-sensitive electrode and a second resistive force-sensitive electrode. Each lower-side resistive force-sensitive electrode may include a third resistive force-sensitive electrode and a fourth resistive force-sensitive electrode. The first resistive force-sensitive electrode, the second resistive force-sensitive electrode, the third resistive force-sensitive electrode, and the fourth resistive force-sensitive electrode may be electrically connected to form a bridge circuit.

In one embodiment, in the bridge circuit, one end of the first resistive force-sensitive electrode may be electrically connected to one end of the third resistive force-sensitive electrode, and one end of the second resistive force-sensitive electrode may be electrically connected to one end of the fourth resistive force-sensitive electrode. Further, another end of the first resistive force-sensitive electrode may be electrically connected to another end of the fourth resistive force-sensitive electrode, and another end of the third resistive force-sensitive electrode may be electrically connected to another end of the second resistive force-sensitive electrode.

Further, a connection node between the first resistive force-sensitive electrode and the third resistive force-sensitive electrode may be connected to one of the positive and negative terminals, and a connection node between the second resistive force-sensitive electrode and the fourth resistive force-sensitive electrode may be connected to the other one of the positive and negative terminals.

Further, a connection node between the first resistive force-sensitive electrode and the fourth resistive force-sensitive electrode may be connected to a first voltage terminal, and a connection node between the third resistive force-sensitive electrode and the second resistive force-sensitive electrode may be connected to a second voltage terminal.

In one embodiment, the fabrication method of the flexible panel may further include proving a first driving circuit (S102). More specifically, the first driving circuit may be electrically connected to a first resistive force-sensitive electrode via a first wire. The first driving circuit may be electrically connected to a second resistive force-sensitive electrode via a second wire.

The fabrication method of the flexible panel may further include providing a second driving circuit (S103). More specifically, the second driving circuit may be electrically connected to a third resistive force-sensitive electrode via a third wire. The second driving circuit may be electrically connected to a fourth resistive force-sensitive electrode via a fourth wire. Further, the second driving circuit may be electrically connected to the first driving circuit.

For example, during a process of forming the stacked structure, a conducting material may be formed on a related film layer, thereby forming wires coupled to each electrode. In one embodiment, the resistance of the first wire L1 may be $R_{line1}$, the resistance of the second wire L2 may be $R_{line2}$, the resistance of the third wire L3 may be $R_{line3}$, the resistance of the fourth wire L4 may be $R_{line4}$, and $R_{line1} * < R_{sensor} * 10\%$, $R_{line2} < R_{sensor} * 10\%$, $R_{line3} < R_{sensor} * 10\%$, $R_{line4} < R_{sensor} * 10\%$. In particular, $R_{sensor}$ is the resistance of each of the first resistive force-sensitive electrode, the second resistive force-sensitive electrode, the third resistive force-sensitive electrode, and the fourth resistive force-sensitive electrode.

In one embodiment, each electrode may be formed by a sensitive grid, as shown in FIG. 15(A) to FIG. 15(D). In one embodiment, a wiring orientation of the first sensitive grid and the first wire may be parallel, perpendicular or form a preset angle, and a wiring orientation of the second sensitive grid and the second wire may be parallel or perpendicular or form a preset angle. A wiring orientation of the third sensitive grid and the third wire may be parallel, perpendicular or form a preset angle, and a wiring orientation of the fourth sensitive grid and the fourth wire may be parallel or perpendicular or form a preset angle.

Further, the wiring orientations of the first sensitive grid, the second sensitive grid, the third sensitive grid, and the fourth sensitive grid may be perpendicular to an extension direction of a short side of the flexible display panel. The wiring orientations of the first sensitive grid and the second sensitive and may be parallel or perpendicular, and the wiring orientations of the third sensitive grid and the fourth sensitive grid may be parallel or perpendicular. Specific arrangement methods may refer to aforementioned descriptions of the flexible display panel.

In one embodiment, forming at least one upper-side resistive force-sensitive electrode on any layer or film above a neutral layer of the stacked structure, and forming at least one lower-side resistive force-sensitive electrode on any layer or film below the neutral layer may include following situations.

The first resistive force-sensitive electrode and the second resistive force sensitive electrode may be respectively formed at a first position and a second position in any layer or film above the neutral layer of the stacked structure. Further, the third resistive force-sensitive electrode and the fourth resistive force-sensitive electrode may be respectively formed at a third position and a fourth position in any layer or film below the neutral layer of the stacked structure.

The orthographic projections of the first resistive three-sensitive electrode and the third resistive force-sensitive electrode on the flexible substrate may be coincided or staggered. Further, the orthographic projections of the second resistive force-sensitive electrode and the fourth resistive force-sensitive electrode on the flexible substrate may be coincided or staggered.

In one embodiment, the first resistive three-sensitive electrode R11, the second resistive force-sensitive electrode R12, the third resistive force-sensitive electrode R31, and the fourth resistive force-sensitive electrode R32 may be made of Mo, Al, Cu, ITO, Ag, or other materials with a relatively small thermal effect (e.g., Cu—Ni alloy). Further, details not disclosed in method embodiments of the present disclosure may refer to embodiments of aforementioned flexible display panel.

According to the present disclosure, the force-sensitive electrodes may be integrated inside the flexible display device, thereby facilitating a thin and light design. Further, when a finger presses the flexible display panel, a film or layer above the neutral plane may be in a compressive stress state, and a film or layer below the neutral plane may be in a stretched stress state. Accordingly, a greater stress difference may be obtained, and the sensitivity of the force sensing may be improved.

It should be clearly understood that the present disclosure describes how to make and practice specific embodiments, and principles of the present disclosure are not limited to any of the exemplary details. Rather, based on the teaching of the content of the present disclosure, these principles may be applied to various other embodiments.

Aforementioned descriptions specifically illustrate and describe exemplary embodiments of the present disclosure. It should be understood that, the present disclosure is not limited to specific structures, configuration manners, or implementation methods described herein. Rather, the present disclosure is intended to cover various modifications and equivalent configurations falling within the spirit and scope of the appended claims.

What is claimed is:

1. A flexible display panel, comprising:
   a stacked structure having a plurality of layers comprising a flexible substrate, a light-emitting device layer, and a polarizing layer stacked in a preset order;
   at least one upper-side resistive force-sensitive electrode disposed on a layer above a neutral plane of the stacked structure; and
   at least one lower-side resistive force-sensitive electrode disposed on a layer below the neutral plane, wherein:
   each upper-side resistive force-sensitive electrode includes a first resistive force-sensitive electrode and a second resistive force-sensitive electrode,
   each lower-side resistive force-sensitive electrode includes a third resistive force-sensitive electrode and a fourth resistive force-sensitive electrode,
   the first resistive force-sensitive electrode, the second resistive force-sensitive electrode, the third resistive force-sensitive electrode, and the fourth resistive force-sensitive electrode are electrically connected to form a bridge circuit,
   the bridge circuit further includes a positive terminal, a negative terminal, a first voltage terminal, and a second voltage terminal,
   one end of the first resistive force-sensitive electrode being electrically connected to one end of the third resistive force-sensitive electrode,
   one end of the second resistive force-sensitive electrode being electrically connected to one end of the fourth resistive force-sensitive electrode,
   another end of the first resistive force-sensitive electrode being electrically connected to another end of the fourth resistive force-sensitive electrode,
   another end of the third resistive force-sensitive electrode being electrically connected to another end of the second resistive force-sensitive electrode,
   a connection node between the first resistive force-sensitive electrode and the third resistive force-sensitive electrode is connected to one of the positive terminal and the negative terminal,
   a connection node between the second resistive force-sensitive electrode and the fourth resistive force-sensitive electrode is connected to the other one of the positive terminal and the negative terminal,
   a connection node between the first resistive force-sensitive electrode and the fourth resistive force-sensitive electrode is connected to the first voltage terminal, and
   a connection node between the third resistive force-sensitive electrode and the second resistive force-sensitive electrode is connected to the second voltage terminal.

2. The flexible display panel according to claim 1, further comprising:
   a first driving circuit electrically connected to the first resistive force-sensitive electrode via a first wire and electrically connected to the second resistive force-sensitive electrode via a second wire; and
   a second driving circuit electrically connected to the third resistive force-sensitive electrode via a third wire and electrically connected to the fourth resistive force-sensitive electrode via a fourth wire;
   wherein the second driving circuit is electrically connected to the first driving circuit.

3. The flexible display panel according to claim 2, wherein:
   a resistance of the first wire L1 is $R_{line1}$, a resistance of the second wire L2 is $R_{line2}$, a resistance of the third wire L3 is $R_{line3}$, a resistance of the fourth wire L4 is $R_{line4}$, and
   $R_{line1} < R_{sensor} * 10\%$, $R_{line2} < R_{sensor} * 10\%$, $R_{line3} < R_{sensor} * 10\%$, and $R_{line4} < R_{sensor} * 10\%$
   wherein $R_{sensor}$ is a resistance of each of the first resistive force-sensitive electrode, the second resistive force-sensitive electrode, the third resistive force-sensitive electrode, and the fourth resistive force-sensitive electrode.

4. The flexible display panel according to claim 2, wherein:
the first resistive force-sensitive electrode includes a first sensitive grid;
the second resistive force-sensitive electrode includes a second sensitive grid;
the third resistive force-sensitive electrode includes a third sensitive grid; and
the fourth resistive force-sensitive electrode includes a fourth sensitive grid.

5. The flexible display panel according to claim 4, wherein:
a wiring orientation of the first sensitive grid is parallel or perpendicular or forms a preset angle with respect to an extension direction of the first wire;
a wiring orientation of the second sensitive grid is parallel or perpendicular or forms a preset angle with respect to an extension direction of the second wire;
a wiring orientation of the third sensitive grid is parallel or perpendicular or forms a preset angle with respect to an extension direction of the third wire; and
a wiring orientation of the fourth sensitive grid is parallel or perpendicular or forms a preset angle with respect to an extension direction of the fourth wire.

6. The flexible display panel according to claim 4, wherein:
the wiring orientation of the first sensitive grid, the second sensitive grid, the third sensitive grid, and the fourth sensitive grid is perpendicular to an extension direction of a short side of the flexible display panel.

7. The flexible display panel according to claim 4, wherein:
the wiring orientations of the first sensitive grid and the second sensitive grid are parallel or perpendicular, and
the wiring orientations of the third sensitive grid and the fourth sensitive grid are parallel or perpendicular.

8. The flexible display panel according to claim 1, wherein:
orthographic projections of the first resistive force-sensitive electrode and the third resistive force-sensitive electrode on the flexible substrate are coincided, and
orthographic projections of the second resistive force-sensitive electrode and the fourth resistive force-sensitive electrode on the flexible substrate are coincided.

9. The flexible display panel according to claim 1, wherein:
orthographic projections of the first resistive force-sensitive electrode and the third resistive force-sensitive electrode on the flexible substrate are staggered, and
orthographic projections of the second resistive force-sensitive electrode and the fourth resistive force-sensitive electrode on the flexible substrate are staggered.

10. The flexible display panel according to claim 1, wherein:
the first resistive force-sensitive electrode, the second resistive force-sensitive electrode, the third resistive force-sensitive electrode, and the fourth resistive force-sensitive electrode are made of a Cu—Ni alloy.

11. A flexible display device including a flexible display panel, wherein the flexible display panel comprises:
a stacked structure having a plurality of layers comprising a flexible substrate, a light-emitting device layer, and a polarizing layer stacked in a preset order;
at least one upper-side resistive force-sensitive electrode disposed on a layer above a neutral plane of the stacked structure; and
at least one lower-side resistive force-sensitive electrode disposed on a layer below the neutral plane, wherein:
each upper-side resistive force-sensitive electrode includes a first resistive force-sensitive electrode and a second resistive force-sensitive electrode,
each lower-side resistive force-sensitive electrode includes a third resistive force-sensitive electrode and a fourth resistive force-sensitive electrode,
the first resistive force-sensitive electrode, the second resistive force-sensitive electrode, the third resistive force-sensitive electrode, and the fourth resistive force-sensitive electrode are electrically connected to form a bridge circuit,
the bridge circuit further includes a positive terminal, a negative terminal, a first voltage terminal, and a second voltage terminal,
one end of the first resistive force-sensitive electrode being electrically connected to one end of the third resistive force-sensitive electrode,
one end of the second resistive force-sensitive electrode being electrically connected to one end of the fourth resistive force-sensitive electrode,
another end of the first resistive force-sensitive electrode being electrically connected to another end of the fourth resistive force-sensitive electrode,
another end of the third resistive force-sensitive electrode being electrically connected to another end of the second resistive force-sensitive electrode,
a connection node between the first resistive force-sensitive electrode and the third resistive force-sensitive electrode is connected to one of the positive terminal and the negative terminal,
a connection node between the second resistive force-sensitive electrode and the fourth resistive force-sensitive electrode is connected to the other one of the positive terminal and the negative terminal,
a connection node between the first resistive force-sensitive electrode and the fourth resistive force-sensitive electrode is connected to the first voltage terminal, and
a connection node between the third resistive force-sensitive electrode and the second resistive force-sensitive electrode is connected to the second voltage terminal.

12. The flexible display panel according to claim 1, further comprising:
a barrier layer sandwiched between the light-emitting device layer and the polarizing layer; and
an upper substrate film disposed on the polarizing layer,
wherein the neutral plane is located in the polarizing layer, or in the barrier layer, or located between the polarizing layer and the barrier layer.

13. The flexible display panel according to claim 1, wherein:
at least one upper-side resistive force-sensitive electrode is formed on the upper substrate film, and
at least one lower-side resistive force-sensitive electrode is formed on the flexible substrate.

14. The flexible display panel according to claim 1, wherein:
at least one upper-side resistive force-sensitive electrode is formed on the upper substrate film, and
at least one lower-side resistive force-sensitive electrode is formed on the barrier layer.

15. The flexible display panel according to claim 1, wherein:
at least one upper-side resistive force-sensitive electrode is formed on the polarizing layer, and at least one lower-side resistive force-sensitive electrode is formed on the flexible substrate.

16. The flexible display panel according to claim 1, wherein:
- at least one upper-side resistive force-sensitive electrode is formed on the polarizing layer, and
- at least one lower-side resistive force-sensitive electrode is formed on the barrier layer.

17. The flexible display panel according to claim 1, wherein:
- at least one upper-side resistive force-sensitive electrode is formed on the barrier layer, and
- at least one lower-side resistive force-sensitive electrode is formed on the flexible substrate.

\* \* \* \* \*